United States Patent
Koyama

(10) Patent No.: US 9,954,110 B2
(45) Date of Patent: Apr. 24, 2018

(54) EL DISPLAY DEVICE AND ELECTRONIC DEVICE

(75) Inventor: Jun Koyama, Sagamihara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 479 days.

(21) Appl. No.: 13/466,510

(22) Filed: May 8, 2012

(65) Prior Publication Data

US 2012/0287027 A1 Nov. 15, 2012

(30) Foreign Application Priority Data

May 13, 2011 (JP) ................. 2011-107763

(51) Int. Cl.
*G09G 3/30* (2006.01)
*H01L 29/786* (2006.01)
(Continued)

(52) U.S. Cl.
CPC ....... *H01L 29/7869* (2013.01); *G09G 3/3275* (2013.01); *H01L 27/1225* (2013.01);
(Continued)

(58) Field of Classification Search
CPC ....... H01L 33/08; H01L 29/786; H01L 21/34; H01L 33/00; H01L 21/336; H01L 21/20;
(Continued)

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

EP 1737044 A 12/2006
EP 1 770 788 A 4/2007
(Continued)

OTHER PUBLICATIONS

Kang et al., "The Effects of Nanocrystalline Silicon Thin Film Thickness on Top Gate Noncrystalline Silicon Thinn Film Transistor Fabricated at 180 degrees C", Jun. 2008, Journal of Semiconductor Technology and Science, vol. 8, No. 2, pp. 111-113.*
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
(Continued)

*Primary Examiner* — Tony N Ngo
(74) *Attorney, Agent, or Firm* — Robinson Intellectual Property Law Office; Eric J. Robinson

(57) ABSTRACT

Provided is an EL display device which is provided with a power supply line driver circuit including a transistor having capability in supplying a large amount of current over an insulating substrate where a pixel portion is formed. An active matrix EL display device includes a plurality of pixels, a plurality of signal lines, a plurality of scan lines, and a plurality of power supply lines over an insulating substrate; a transistor formed using an oxide semiconductor with a field-effect mobility of at least higher than or equal to 80 $cm^2/Vs$, preferably higher than or equal to 120 $cm^2/Vs$ over the insulating substrate; and a power supply line driver circuit including the transistor as a component.

23 Claims, 24 Drawing Sheets

(51) Int. Cl.
  *G09G 3/3275* (2016.01)
  *H01L 27/12* (2006.01)
  *H01L 29/66* (2006.01)
  *H01L 27/32* (2006.01)

(52) U.S. Cl.
  CPC ............... *H01L 29/66969* (2013.01); *G09G 2310/0297* (2013.01); *G09G 2330/028* (2013.01); *H01L 27/3262* (2013.01)

(58) Field of Classification Search
  CPC ..... H01L 31/113; H01L 31/062; H01L 21/00; H01B 1/00; G09G 3/20
  See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,989,805 | B2 | 1/2006 | Inukai |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,737,924 | B2 | 6/2010 | Koyama |
| 7,768,008 | B2 | 8/2010 | Ishizaki et al. |
| 8,115,883 | B2 | 2/2012 | Yamazaki et al. |
| 8,143,115 | B2 | 3/2012 | Omura et al. |
| 8,148,721 | B2 | 4/2012 | Hayashi et al. |
| 8,158,974 | B2 | 4/2012 | Yano et al. |
| 8,269,696 | B2 | 9/2012 | Tomida et al. |
| 8,333,913 | B2 | 12/2012 | Inoue et al. |
| 8,488,077 | B2 | 7/2013 | Yamazaki et al. |
| 8,668,849 | B2 | 3/2014 | Inoue et al. |
| 8,698,970 | B2 | 4/2014 | Yamazaki et al. |
| 8,779,419 | B2 | 7/2014 | Yano et al. |
| 8,879,011 | B2 | 11/2014 | Yamazaki et al. |
| 8,912,988 | B2 | 12/2014 | Tomida et al. |
| 8,994,889 | B2 | 3/2015 | Yamazaki et al. |
| 9,024,312 | B2 | 5/2015 | Fukuda et al. |
| 9,029,191 | B2 | 5/2015 | Yamazaki et al. |
| 9,135,856 | B2 | 9/2015 | Tomida et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0038182 | A1* | 2/2006 | Rogers ............... B82Y 10/00 257/77 |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0113597 | A1* | 6/2006 | Ono ............... H01L 29/42384 257/347 |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0072439 | A1 | 3/2007 | Akimoto et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0268210 | A1 | 11/2007 | Uchino et al. |
| 2007/0272922 | A1 | 11/2007 | Kim et al. |
| 2007/0287221 | A1 | 12/2007 | Ong et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0099803 | A1 | 5/2008 | Li et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065837 | A1 | 3/2010 | Omura et al. |
| 2010/0065844 | A1 | 3/2010 | Tokunaga |
| 2010/0066714 | A1* | 3/2010 | Ozaki ............... G09G 3/2081 345/207 |
| 2010/0092800 | A1 | 4/2010 | Itagaki et al. |
| 2010/0109002 | A1 | 5/2010 | Itagaki et al. |
| 2010/0201262 | A1* | 8/2010 | Tamonoki ........... H01L 27/3272 313/505 |
| 2011/0062435 | A1 | 3/2011 | Yamazaki et al. |
| 2011/0084266 | A1 | 4/2011 | Yamazaki et al. |
| 2011/0140099 | A1* | 6/2011 | Yamazaki ........... H01L 27/0688 257/43 |
| 2011/0240988 | A1 | 10/2011 | Yano et al. |
| 2012/0012847 | A1 | 1/2012 | Koyama et al. |
| 2012/0168750 | A1 | 7/2012 | Hayashi et al. |
| 2012/0306729 | A1 | 12/2012 | Tomida et al. |
| 2015/0084048 | A1 | 3/2015 | Hayashi et al. |
| 2015/0179675 | A1 | 6/2015 | Yamazaki et al. |

(56) References Cited

U.S. PATENT DOCUMENTS

| | | |
|---|---|---|
| 2015/0194508 A1 | 7/2015 | Yamazaki et al. |
| 2015/0303072 A1 | 10/2015 | Yamazaki et al. |
| 2015/0349043 A1 | 12/2015 | Tomida et al. |
| 2016/0201187 A1 | 7/2016 | Yano et al. |

FOREIGN PATENT DOCUMENTS

| | | |
|---|---|---|
| EP | 1 921 681 A | 5/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-032057 A | 1/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-234188 A | 8/2003 |
| JP | 2004-103957 A | 4/2004 |
| JP | 2004-273614 A | 9/2004 |
| JP | 2004-273732 A | 9/2004 |
| JP | 2004-302313 A | 10/2004 |
| JP | 2007-096055 A | 4/2007 |
| JP | 2007-123861 A | 5/2007 |
| JP | 2007-194594 A | 8/2007 |
| JP | 2007-310311 A | 11/2007 |
| JP | 2008-166716 A | 7/2008 |
| JP | 2009-014796 A | 1/2009 |
| JP | 2009-231664 A | 10/2009 |
| JP | 2010-039414 A | 2/2010 |
| JP | 2011-030171 A | 2/2011 |
| JP | 2011-071503 A | 4/2011 |
| JP | 2011-071534 A | 4/2011 |
| JP | 2011-091379 A | 5/2011 |
| JP | 2011-097007 A | 5/2011 |
| JP | 2011-192958 A | 9/2011 |
| WO | WO-2004/114391 | 12/2004 |
| WO | WO-2008/069056 | 6/2008 |
| WO | WO-2008/069255 | 6/2008 |
| WO | WO-2008/114588 | 9/2008 |
| WO | WO-2008/117739 | 10/2008 |
| WO | WO-2010/023889 | 3/2010 |
| WO | WO-2011/033993 | 3/2011 |
| WO | WO-2011/037213 | 3/2011 |

OTHER PUBLICATIONS

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZNO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZNO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa. Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

(56) References Cited

OTHER PUBLICATIONS

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka. Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m <4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZNO Thin-Film Transistors Produced At Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

(56) References Cited

OTHER PUBLICATIONS

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno,K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

International Search Report (Application No. PCT/JP2010/070062) dated Feb. 8, 2011.

Written Opinion (Application No. PCT/JP2010/070062) dated Feb. 8, 2011.

Korean Office Action (Application No. 2012-0048732) dated Feb. 14, 2018.

\* cited by examiner

● In
☾ Sn
⌒ Zn
• O

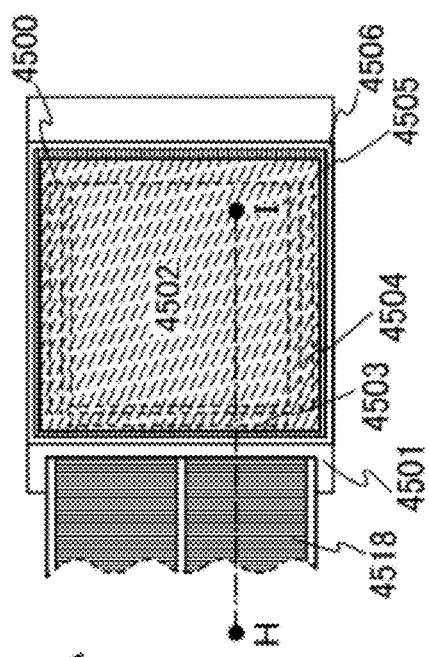
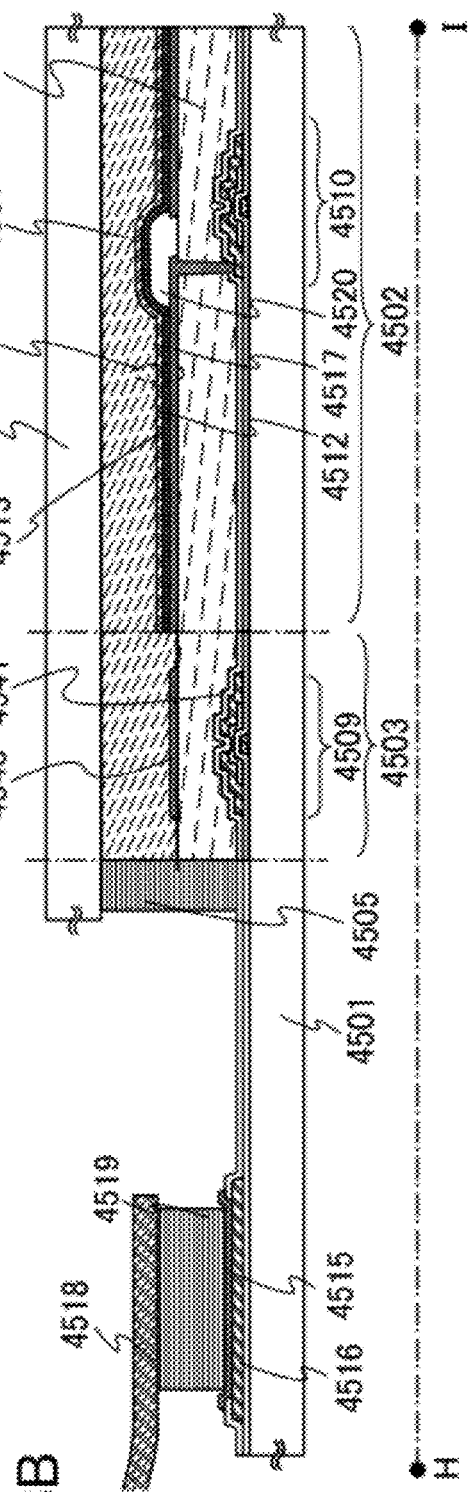
FIG. 18A
FIG. 18B

EL DISPLAY DEVICE AND ELECTRONIC DEVICE

BACKGROUND OF THE INVENTION

1. Field of the Invention

The present invention relates to an EL display device and an electronic device including the EL display device.

2. Description of the Related Art

A transistor for driving a display element in a display device includes a silicon film or the like formed over a glass substrate or the like. Although a transistor including amorphous silicon has low field-effect mobility, it can be formed over a larger glass substrate. On the other hand, a transistor including polycrystalline silicon has high field-effect mobility, but it is not suitable for a larger glass substrate and used in a small or medium display device.

In a display device in which a light-emitting element such as an EL element is driven with the use of a transistor including polycrystalline silicon (EL display device), there is variation in threshold voltage and mobility among transistors including polycrystalline silicon in plural pixels. Patent Document 1 discloses a structure for reducing variation in threshold voltage and mobility among transistors.

REFERENCE

Patent Document

[Patent Document 1] Japanese Published Patent Application No. 2007-310311

SUMMARY OF THE INVENTION

FIG. 23 illustrates a pixel 800 having a pixel structure disclosed in Patent Document 1. The pixel 800 includes a sampling transistor 801, a driving transistor 802, an EL element 803, a capacitor 804, a capacitor 805, a signal line 806, a scan line 807, a power supply line 808, and a common electrode 809.

FIG. 24 is a block diagram of an EL display device. An EL display device 900 includes the pixels 800 provided in a matrix in a pixel portion 904. As illustrated in FIG. 24, the pixel portion 904 is surrounded by a signal line driver circuit 901, a scan line driver circuit 902, and a power supply line driver circuit 903. The signal line driver circuit 901, the scan line driver circuit 902, and the power supply line driver circuit 903 drive the signal line 806, the scan line 807, and the power supply line 808, respectively.

In the structure disclosed in Patent Document 1, n-channel transistors are used for the sampling transistor 801 and the driving transistor 802. In a general EL display device, an anode voltage of a power supply line is supplied from an external constant voltage source, but in the structure of Patent Document 1, a voltage of the power supply line 808 is supplied per row by scanning by the power supply line driver circuit 903.

In addition, in the structure disclosed in Patent Document 1, measures against deterioration of the EL element 803 are taken and variation in threshold voltage and mobility of the driving transistor 802 is reduced by performing a plurality of operations in addition to driving of the power supply line 808. Japanese Published Patent Application No. 2007-310311 may be referred to for details of the operations.

As a result, the EL display device with less unevenness in which an influence of variation in threshold voltage and mobility of the driving transistor 802 and deterioration of the EL element 803 are small can be achieved.

However, the technique disclosed in Patent Document 1 has a problem in that a substrate over which the transistor is formed is difficult to enlarge because the transistor includes polycrystalline silicon. This is because in the case where polycrystalline silicon is formed over the glass substrate through a low-temperature process, laser crystallization is used; however, laser crystallization is not suitable for a larger glass substrate.

On the other hand, in the case where an EL display device is formed using a transistor including amorphous silicon, the transistor can be formed over a larger substrate, but the mobility of the transistor is low. Thus, when the power supply line driver circuit 903 with the circuit structure in FIG. 24 is formed using the transistor including amorphous silicon, there is a problem in that a large amount of current cannot be supplied.

In FIG. 23 and FIG. 24, a predetermined operation of the power supply line driver circuit 903 is performed by repeating on states and off states thereof as in the case of the scan line driver circuit 902. Although the scan line driver circuit 902 only supplies voltage to the scan line 807, the power supply line driver circuit 903 needs to supply current, to the power supply line 808, for making the EL element 803 emit light, so that the transistor in the power supply line driver circuit 903 needs to have capability in supplying a large amount of current.

In view of the above, it is an object of an embodiment of the present invention to provide an EL display device provided with a power supply line driver circuit including a transistor having capability in supplying a large amount of current over an insulating substrate where a pixel portion is formed.

An embodiment of the present invention disclosed in this specification is an active matrix EL display device including: a plurality of pixels, a plurality of signal lines, a plurality of scan lines, and a plurality of power supply lines over an insulating substrate; an oxide semiconductor transistor whose field-effect mobility is at least higher than or equal to 80 cm$^2$/Vs, preferably higher than or equal to 120 cm$^2$/Vs over the insulating substrate; and a power supply line driver circuit including the transistor as a component.

An embodiment of the present invention disclosed in this specification is an active matrix EL display device including: a plurality of pixels, a plurality of signal lines, a plurality of scan lines, and a plurality of power supply lines over an insulating substrate; a transistor whose field-effect mobility is at least higher than or equal to 80 cm$^2$/Vs over the insulating substrate; and a power supply line driver circuit including the transistor as a component, in which the transistor preferably includes an oxide semiconductor layer.

An embodiment of the present invention disclosed in this specification is an active matrix EL display device including: a plurality of pixels, a plurality of signal lines, a plurality of scan lines, and a plurality of power supply lines over an insulating substrate; a plurality of transistors whose field-effect mobility is at least higher than or equal to 80 cm$^2$/Vs over the insulating substrate; and a power supply line driver circuit and a scan line driver circuit including the transistors as components, in which the transistors each preferably include an oxide semiconductor layer.

An embodiment of the present invention disclosed in this specification is an active matrix EL display device including: a plurality of pixels, a plurality of signal lines, a plurality of scan lines, and a plurality of power supply lines over an insulating substrate; a plurality of transistors whose field-effect mobility is at least higher than or equal to 80 cm$^2$/Vs over the insulating substrate; and a power supply line driver circuit, a scan line driver circuit, and a signal line driver circuit including the transistors as components, in which the transistors each preferably include an oxide semiconductor layer.

In an embodiment of the present invention, the transistor in the EL display device preferably has a field-effect mobility of higher than or equal to 120 cm$^2$/Vs.

In the EL display device of an embodiment of the present invention, a sampling transistor and a driving transistor in each of the pixels preferably include an oxide semiconductor layer.

In the EL display device of an embodiment of the present invention, the oxide semiconductor layer preferably includes at least a channel formation region overlapping with a gate electrode layer with a gate insulating layer interposed therebetween.

In the EL display device of an embodiment of the present invention, the oxide semiconductor layer is preferably highly purified.

In the EL display device of an embodiment of the present invention, the oxide semiconductor layer that is highly purified preferably contains at least one kind of element selected from the group consisting of In, Sn, and Zn.

In an embodiment of the present invention, in order to improve the field-effect mobility, oxygen is supplied to an oxide semiconductor included in a transistor from an insulating film proximate to the oxide semiconductor and/or by ion implantation, and the oxygen reduces oxygen vacancies part of which cause a carrier. In addition, in order to improve the field-effect mobility, in the manufacturing process of the transistor, the oxide semiconductor is highly purified, and the concentration of hydrogen part of which causes a carrier is drastically reduced.

A process for forming an oxide semiconductor in an embodiment of the present invention is specifically described below using cross-sectional views in FIGS. 1A to 1D.

First, a base insulating film 10 from which oxygen is released by heat treatment is formed, and an oxide semiconductor film 11 is formed over the base insulating film 10 (FIG. 1A). Then, first heat treatment is performed on the base insulating film 10 and the oxide semiconductor film 11 which are stacked (FIG. 1B).

When the insulating film from which oxygen is released by heat treatment is provided as the base insulating film 10 serving as a gate insulating layer or the like, oxygen vacancies caused in the oxide semiconductor film 11 can be compensated by heat treatment in a later step. Part of the oxygen vacancies in the oxide semiconductor film 11 generate a carrier, which can cause variation in threshold voltage of the obtained transistor.

In addition, when the base insulating film 10 from which oxygen is released by heat treatment is provided, interface states between the base insulating film 10 and the oxide semiconductor film 11 can be reduced. The interface states trap electric charge generated as a result of operation of the obtained transistor in some cases and thus can be a factor that causes a reduction in reliability of the transistor.

Note that the base insulating film 10 is preferably flat. Specifically, the base insulating film 11 has an average surface roughness (R$_a$) of less than or equal to 1 nm, preferably less than or equal to 0.3 nm, more preferably less than or equal to 0.1 nm. The base insulating film 10 may be subjected to planarization treatment such as chemical mechanical polishing (CMP) treatment. When the base insulating film 10 is flat, the state of an interface between the base insulating film 10 and the oxide semiconductor film 11 is favorable, whereby the field-effect mobility can be increased and variation in threshold voltage can be reduced in the obtained transistor.

In particular, the oxide semiconductor film 11 is preferably formed using an In—Sn—Zn-based oxide, in which case a transistor with high field-effect mobility and high reliability can be obtained. This also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Pm—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a one-component metal oxide such as an In-based oxide, an Sn-based oxide, or a Zn-based oxide; and the like.

Note that the oxide semiconductor film 11 is preferably formed while a substrate is heated because in that case, the obtained transistor can have increased field-effect mobility. Substrate heating temperature at the time of formation of the oxide semiconductor film 11 is higher than or equal to 100° C. and lower than or equal to 600° C., preferably higher than or equal to 150° C. and lower than or equal to 550° C., more preferably higher than or equal to 200° C. and lower than or equal to 500° C. The oxide semiconductor film 11 is preferably formed by a sputtering method.

Note that the band gap of the oxide semiconductor film 11 is greater than or equal to 2.5 eV, preferably greater than or equal to 2.8 eV, more preferably greater than or equal to 3.0 eV. When the band gap of the oxide semiconductor film 11 is in the above range, the transistor can have extremely small off-state current.

Note that the oxide semiconductor film 11 is in a single crystal state, a polycrystalline (also referred to as polycrystal) state, an amorphous state, or the like. The oxide semiconductor film 11 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

The first heat treatment is performed in a reduced-pressure atmosphere (lower than or equal to 10 Pa), an inert atmosphere (an atmosphere of an inert gas such as nitrogen or a rare gas), or an oxidizing atmosphere (an atmosphere containing an oxidizing gas such as oxygen, ozone, or nitrous oxide at higher than or equal to 10 ppm) at a temperature of higher than or equal to 250° C. and lower than or equal to 650° C., preferably higher than or equal to 300° C. and lower than or equal to 600° C.

By the first heat treatment, the concentration of impurities such as hydrogen in the oxide semiconductor film 11 can be reduced. Alternatively, the state of the interface between the base insulating film 10 and the oxide semiconductor film 11 can be made favorable. Since the first heat treatment is performed after the oxide semiconductor film 11 is formed, outward diffusion of oxygen that is released from the base insulating film 10 can be prevented. Note that it is alternatively possible that heat treatment is performed in an inert atmosphere or a reduced-pressure atmosphere, the atmosphere is then changed to an oxidizing atmosphere without changing the temperature, and heat treatment is performed in the oxidizing atmosphere. When the first heat treatment is performed in this manner, impurities in the oxide semiconductor film 11 can be reduced in the inert atmosphere or the reduced-pressure atmosphere and then oxygen vacancies caused at the time of removal of impurities can be reduced in the oxidizing atmosphere.

Note that a gas containing fewer impurities is used for the heat treatment and film formation. Specifically, a gas whose dew point is lower than or equal to −70° C. may be used.

After the first heat treatment, the oxide semiconductor film 11 is processed into an island-shaped oxide semiconductor film 12. Processing for obtaining the oxide semiconductor film 12 can be performed in such a manner that a resist mask is formed with the use of a photomask and a part in which the resist mask is not formed is etched by a dry etching method or a wet etching method. Such a process is called a photolithography process.

Then, a conductive film is formed and processed by a photolithography process or the like, so that a source electrode 13A and a drain electrode 13B which are at least partly in contact with the oxide semiconductor film are formed.

Then, an upper insulating film 14 serving as an interlayer insulating film is formed (FIG. 1C). As the upper insulating film 14, an insulating film from which oxygen is released by heat treatment is preferably used.

Next, second heat treatment is performed (FIG. 1D). The second heat treatment can be performed under a condition similar to that of the first heat treatment. By performing the second heat treatment, oxygen is released from the base insulating film 10 and the upper insulating film 14, so that oxygen vacancies in the island-shaped oxide semiconductor film 12 can be reduced. In addition, since interface states between the base insulating film 10 and the island-shaped oxide semiconductor film 12 and interface states between the island-shaped oxide semiconductor film 12 and the upper insulating film 14 can be reduced, the field-effect mobility of the transistor obtained can be increased, variation in threshold voltage can be reduced, and the reliability can be improved.

In the above-described manner, a highly reliable transistor can be manufactured which includes an oxide semiconductor and has high field-effect mobility and in which variation in threshold voltage is small.

Note that an interlayer insulating film is preferably formed to cover the upper insulating film 14 over the transistor. By provision of the interlayer insulating film, outward diffusion of oxygen that is released from the base insulating film 10 and the upper insulating film 14 from the transistor can be prevented. In the case where the interlayer insulating film is provided, the second heat treatment may be performed after formation of the interlayer insulating film.

A transistor which is obtained in the above manner has high field-effect mobility (e.g., a field-effect mobility of higher than or equal to 31 cm$^2$/Vs), small variation in threshold voltage, high reliability (e.g., a fluctuation range of threshold voltage by a negative BT test is less than or equal to 1 V), and extremely small off-state current.

Next, theory that the field-effect mobility of an insulated gate transistor can be increased with the use of a highly purified oxide semiconductor will be described.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When the Levinson model is used, a field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the mobility $\mu$ can be expressed as Formula (1).

$$\mu = \mu_0 \exp\left(-\frac{E}{kT}\right) \qquad (1)$$

Here, E represents the height of the potential barrier, k represents the Boltzmann constant, and T represents the absolute temperature. When the potential barrier is assumed to be attributed to a defect, Formula (2) can be obtained according to the Levinson model.

$$E = \frac{e^2 N^2}{8\varepsilon n} = \frac{e^3 N^2 t}{8\varepsilon C_{ox} V_g} \qquad (2)$$

Here, e represents the elementary electric charge, N represents the average defect density per unit area in a channel, $\in$ represents the dielectric constant of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer.

The drain current $I_d$ in a linear region can be expressed as Formula (3).

$$I_d = \frac{W \mu V_g V_d C_{ox}}{L} \exp\left(-\frac{E}{kT}\right) \qquad (3)$$

Here, L represents the channel length and W represents the channel width, and L and W are each 10 μm in this case. In addition, $V_d$ represents the drain voltage.

When dividing both sides of the above formula by $V_g$ and then taking logarithms of both sides, Formula (4) is obtained.

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \quad (4)$$

The right side of the Formula (4) is a function of $V_g$. From the formula, it is found that the defect density N can be obtained from the slope of a line in a graph which is obtained by plotting actual measured values with $\ln(I_d/V_g)$ as the vertical axis and $1/V_g$ as the horizontal axis. That is, the defect density can be evaluated from the $I_d$–$V_g$ characteristics of the transistor. The defect density N of an oxide semiconductor in which the ratio of indium (In), tin (Sn), and zinc (Zn) is 1:1:1 is approximately $1\times10^{12}/\text{cm}^2$.

On the basis of the defect density obtained in this manner or the like, $\mu_0$ can be calculated to be 120 cm²/Vs from Formula (1) and Formula (2). The measured mobility of an In—Sn—Zn oxide including a defect is approximately 40 cm²/Vs. However, assuming that no defect exists inside the semiconductor and at the interface between the semiconductor and the insulating film, the mobility $\mu_0$ of the oxide semiconductor is expected to be 120 cm²/Vs.

Note that even when no defect exists inside a semiconductor, scattering at an interface between a channel and a gate insulating film affects the transport property of the transistor. In other words, the mobility $\mu_1$ at a position that is distance x away from the interface between the channel and the gate insulating film can be expressed as Formula (5).

$$\frac{1}{\mu_1} = \frac{1}{\mu_0} + \frac{D}{B}\exp\left(-\frac{x}{l}\right) \quad (5)$$

Here, D represents the electric field in the gate direction, and B and l are constants. B and l can be obtained from actual measurement results; according to the above measurement results, B is $4.75\times10^7$ cm/s and l is 10 nm (the depth to which the influence of interface scattering reaches). When D is increased (i.e., when the gate voltage is increased), the second term of Formula (5) is increased and accordingly the mobility $\mu_1$ is decreased.

Calculation results of the mobility $\mu_2$ of a transistor, a channel of which includes an ideal oxide semiconductor without a defect inside the semiconductor, are shown in FIG. 2. For the calculation, device simulation software, Sentaurus Device, manufactured by Synopsys, Inc. was used, and the band gap, the electron affinity, the relative dielectric constant, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative dielectric constant thereof was assumed to be 4.1. The channel length and the channel width were each assumed to be 10 μm, and the drain voltage $V_d$ was assumed to be 0.1 V.

As shown in FIG. 2, the mobility has a peak of higher than or equal to 100 cm²/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which were manufactured using an oxide semiconductor with such mobility are shown in FIGS. 3A to 3C, FIGS. 4A to 4C, and FIGS. 5A to 5C. FIGS. 6A and 6B illustrate structures of transistors used for calculation. The transistors illustrated in FIGS. 6A and 6B each include a semiconductor region 103a and a semiconductor region 103c which have n$^+$-type conductivity in an oxide semiconductor layer. The resistivity of the semiconductor region 103a and the semiconductor region 103c are $2\times10^{-3}$ Ωcm.

The transistor illustrated in FIG. 6A is formed over a base insulator 101 and an embedded insulator 102 which is embedded in the base insulator 101 and formed of aluminum oxide. The transistor includes the semiconductor region 103a, the semiconductor region 103c, an intrinsic semiconductor region 103b serving as a channel formation region therebetween, and a gate 105. The width of the gate 105 is 33 nm.

A gate insulating film 104 is formed between the gate 105 and the semiconductor region 103b. In addition, a sidewall insulator 106a and a sidewall insulator 106b are formed on both side surfaces of the gate 105, and an insulator 107 is formed over the gate 105 so as to prevent a short circuit between the gate 105 and other wirings. The sidewall insulator has a width of 5 nm A source 108a and a drain 108b are provided in contact with the semiconductor region 103a and the semiconductor region 103c, respectively. Note that the channel width of this transistor is 40 nm The transistor of FIG. 6B is the same as the transistor of FIG. 6A in that it is formed over the base insulator 101 and the embedded insulator 102 formed of aluminum oxide and that it includes the semiconductor region 103a, the semiconductor region 103c, the intrinsic semiconductor region 103b provided therebetween, the gate 105 having a width of 33 nm, the gate insulating film 104, the sidewall insulator 106a, the sidewall insulator 106b, the insulator 107, the source 108a, and the drain 108b.

The transistor illustrated in FIG. 6A is different from the transistor illustrated in FIG. 6B in the conductivity type of semiconductor regions under the sidewall insulator 106a and the sidewall insulator 106b. In the transistor illustrated in FIG. 6A, the semiconductor regions under the sidewall insulator 106a and the sidewall insulator 106b are part of the semiconductor region 103a having n$^+$-type conductivity and part of the semiconductor region 103c having n$^+$-type conductivity, whereas in the transistor illustrated in FIG. 6B, the semiconductor regions under the sidewall insulator 106a and the sidewall insulator 106b are part of the intrinsic semiconductor region 103b. In other words, in the semiconductor layer of FIG. 6B, a region having a width of $L_{off}$ in which the semiconductor region 103a (the semiconductor region 103c) and the gate 105 do not overlap is provided. This region is called an offset region, and the width $L_{off}$ is called an offset length. As is seen from the drawing, the offset length is equal to the width of the sidewall insulator 106a (the sidewall insulator 106b).

The other parameters used in calculation are as described above. For the calculation, device simulation software, Sentaurus Device, manufactured by Synopsys, Inc. was used. FIGS. 3A to 3C show the gate voltage ($V_g$: a potential difference between the gate and the source) dependence of the drain current ($I_d$, a solid line) and the mobility (μ, a dotted line) of the transistor having the structure illustrated in FIG. 6A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 3A shows the gate voltage dependence of the transistor in the case where the thickness of the gate insulating layer is 15 nm, FIG. 3B shows that of the transistor in the case where the thickness of the gate insulating layer is 10 nm, and FIG. 3C shows that of the transistor in the case where the thickness of the gate insulating layer is 5 nm. As the gate insulating layer is thinner, the drain current $I_d$ particularly in an off state (off-state current) is significantly decreased. In contrast, there is no noticeable change in the peak value of the mobility μ and the drain current $I_d$ in an on state (on-state current). The graphs show that the drain current exceeds 10 μA, which is required in a memory element and the like, at a gate voltage of around 1 V.

FIGS. 4A to 4C show the gate voltage $V_g$ dependence of the drain current $I_d$ (a solid line) and the mobility μ (a dotted line) of the transistor having the structure illustrated in FIG. 6B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 4A shows the gate voltage dependence of the transistor in the case where the thickness of the gate insulating layer is 15 nm, FIG. 4B shows that of the transistor in the case where the thickness of the gate insulating layer is 10 nm, and FIG. 4C shows that of the transistor in the case where the thickness of the gate insulating layer is 5 nm Further, FIGS. 5A to 5C show the gate voltage dependence of the drain current $I_d$ (a solid line) and the mobility μ (a dotted line) of the transistor having the structure illustrated in FIG. 6B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 5A shows the gate voltage dependence of the transistor in the case where the thickness of the gate insulating layer is 15 nm, FIG. 5B shows that of the transistor in the case where the thickness of the gate insulating layer is 10 nm, and FIG. 5C shows that of the transistor in the case where the thickness of the gate insulating layer is 5 nm In either of the structures, as the gate insulating layer is thinner, the off-state current is significantly decreased, whereas no noticeable change arises in the peak value of the mobility μ and the on-state current.

Note that the peak of the mobility μ is approximately 80 cm²/Vs in FIGS. 3A to 3C, approximately 60 cm²/Vs in FIGS. 4A to 4C, and approximately 40 cm²/Vs in FIGS. 5A to 5C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current.

The transistor as described above which includes a highly purified oxide semiconductor in a channel formation region has a high field-effect mobility of higher than or equal to 80 cm²/Vs, further higher than or equal to 120 cm²/Vs, can be formed over an insulating substrate where a pixel portion is formed, and has capability in supplying a large amount of current.

By using the transistor including a highly purified oxide semiconductor for a channel formation region, an EL display device in which a pixel portion and a power supply line driver circuit are provided over the same insulating substrate can be provided.

BRIEF DESCRIPTION OF THE DRAWINGS

FIGS. 18A and 18B illustrate an EL display device according to an embodiment of the present invention.

DETAILED DESCRIPTION OF THE INVENTION

Figure 1A:
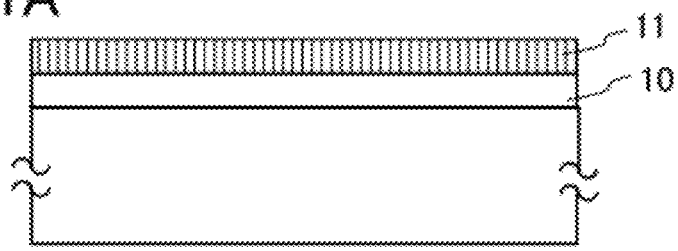
FIGS. 1A to 1D are cross-sectional views illustrating an embodiment of the present invention.
Figure 1B:
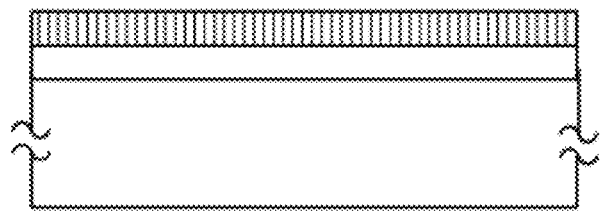
Figure 1C:
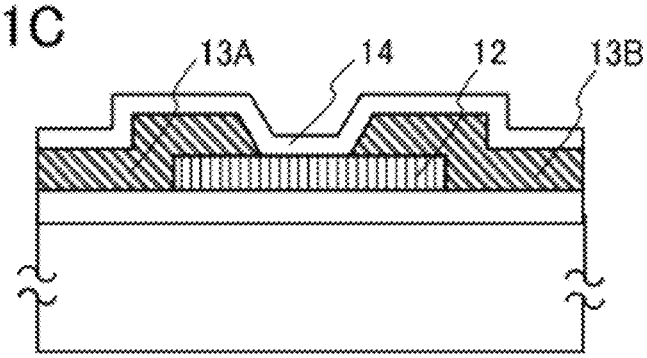
Figure 1D:
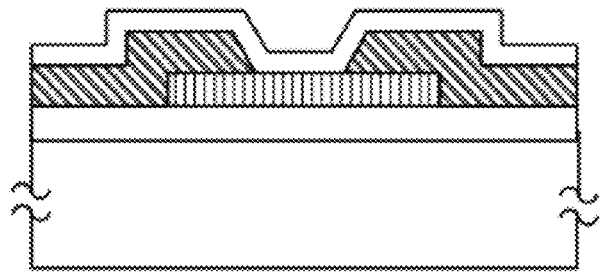
Figure 2:
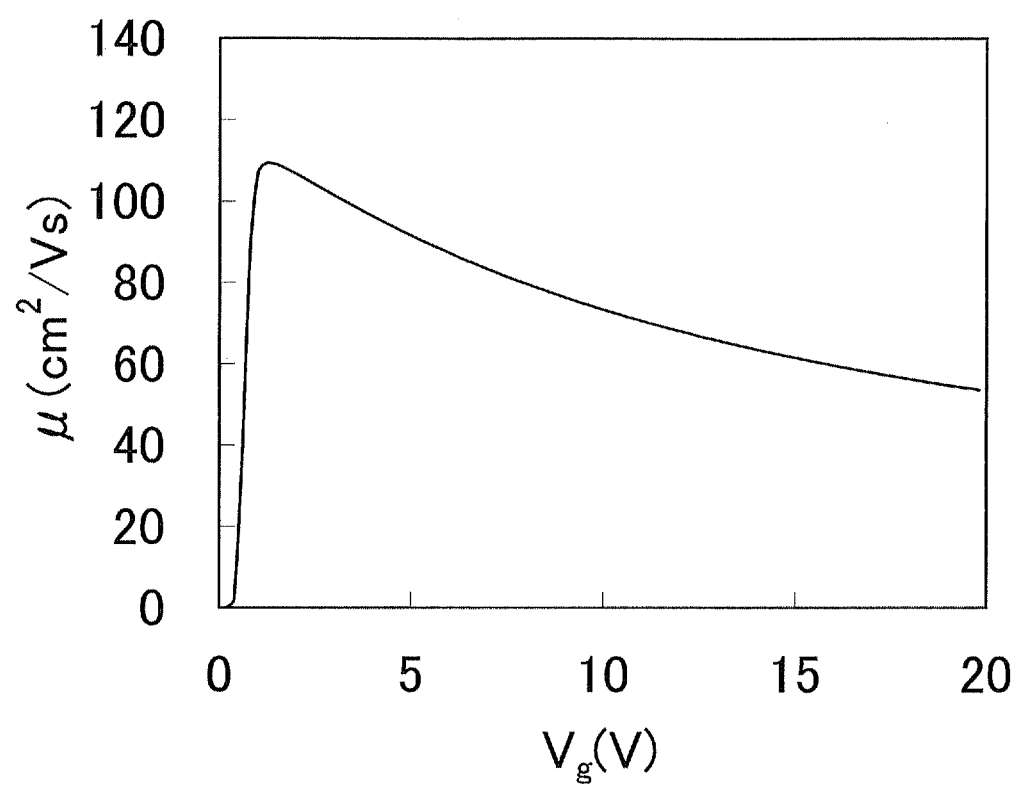
FIG. 2 is a graph showing gate voltage dependence of mobility obtained by calculation.
Figure 3A:
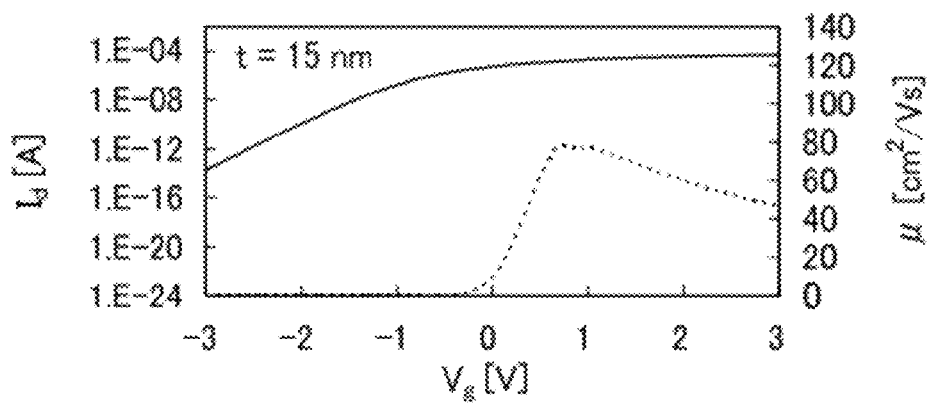
FIGS. 3A to 3C are graphs each showing gate voltage dependence of drain current and mobility obtained by calculation.
Figure 3B:
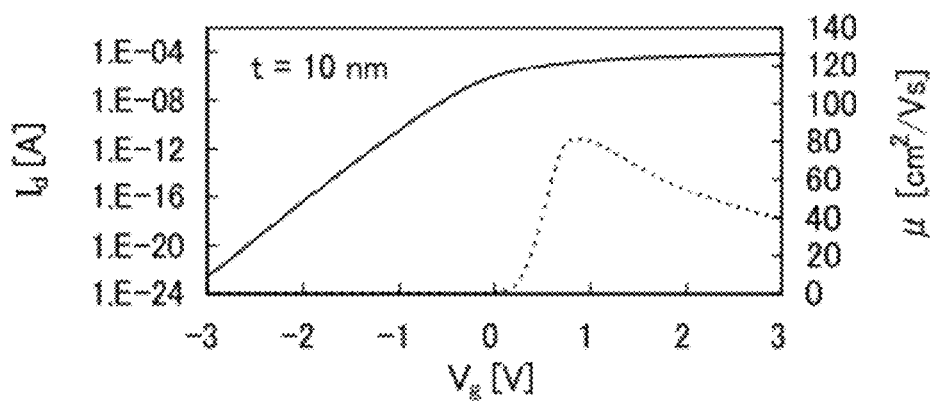
Figure 3C:
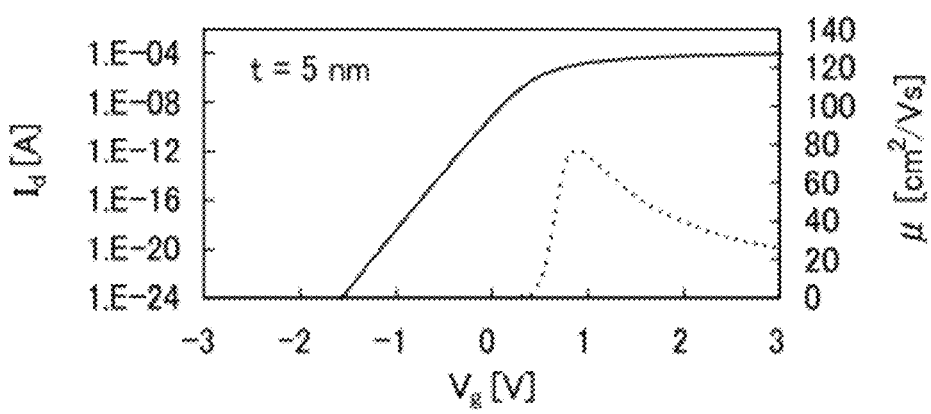
Figure 4A:
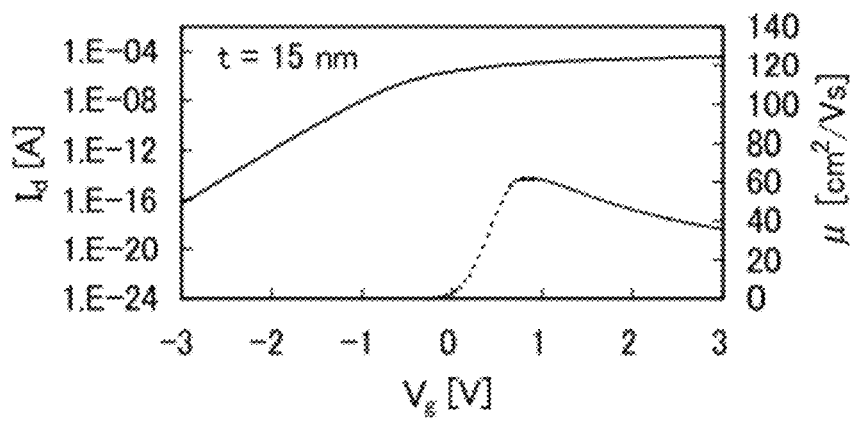
FIGS. 4A to 4C are graphs each showing gate voltage dependence of drain current and mobility obtained by calculation.
Figure 4B:
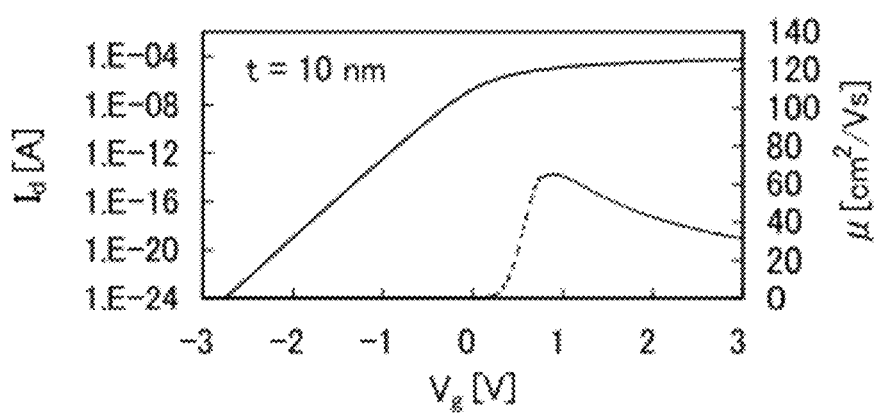
Figure 4C:
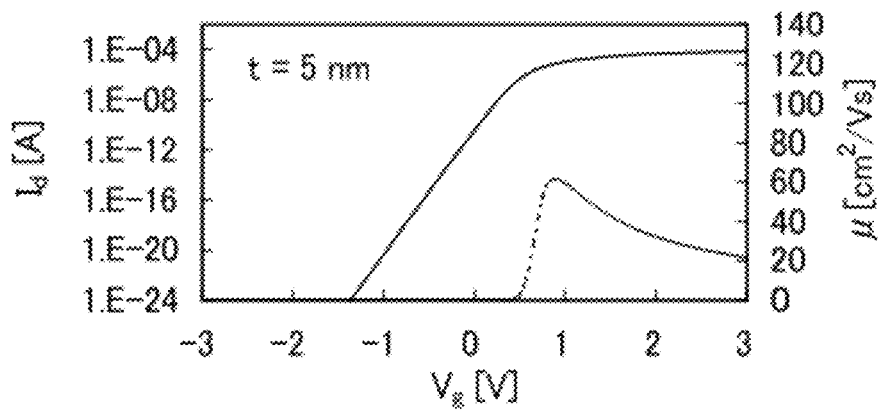
Figure 5A:
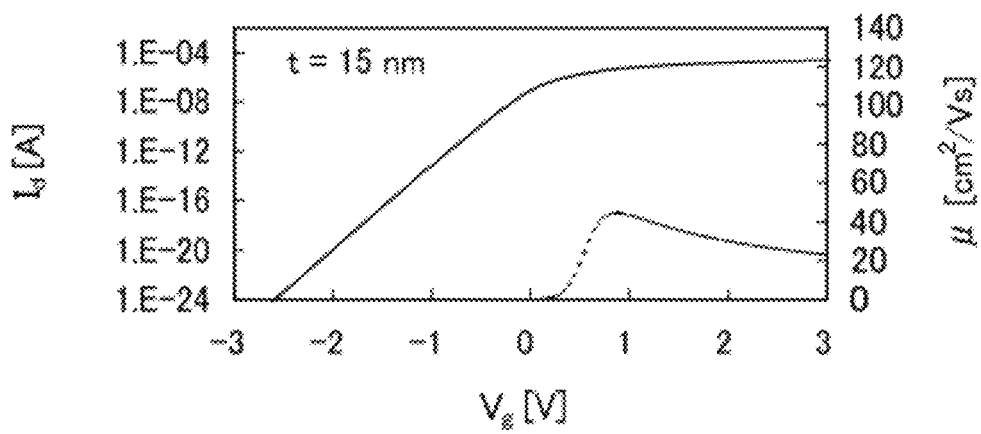
FIGS. 5A to 5C are graphs each showing gate voltage dependence of drain current and mobility obtained by calculation.
Figure 5B:
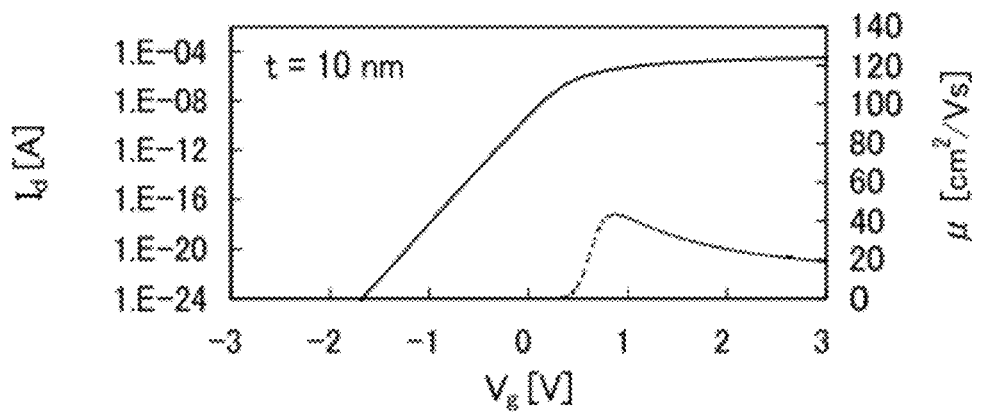
Figure 5C:
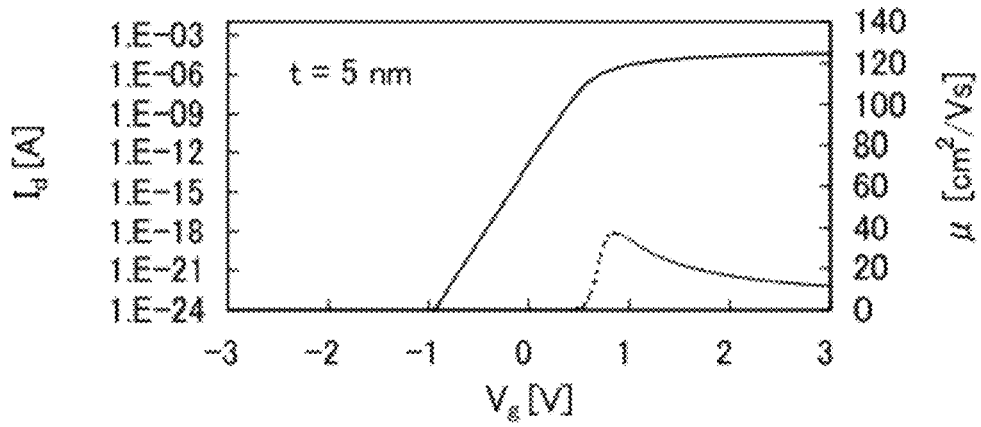

Hereinafter, embodiments and an example of the present invention will be described with reference to the accompanying drawings. Note that the present invention can be carried out in many different modes, and those skilled in the art could appreciate that a variety of modifications can be made to the modes and details thereof without departing from the spirit and the scope of the present invention. Thus, the present invention should not be interpreted as being limited to the description of the embodiments and the example. Note that in structures of the present invention described below, reference numerals denoting the same portions are used in common in different drawings.

Note that the size, the thickness of a layer, and a region of each structure illustrated in the drawings and the like in the embodiments are exaggerated for simplicity in some cases. Therefore, embodiments of the present invention are not limited to such scales.

Note that when it is explicitly described that "A and B are connected," the case where A and B are electrically connected, the case where A and B are functionally connected, and the case where A and B are directly connected are included therein.

Note that in this specification, the terms "first", "second", "third", and "n-th" (n is a natural number) are used in order to avoid confusion among components and do not limit the number of components.

Embodiment 1

Figure 7A:
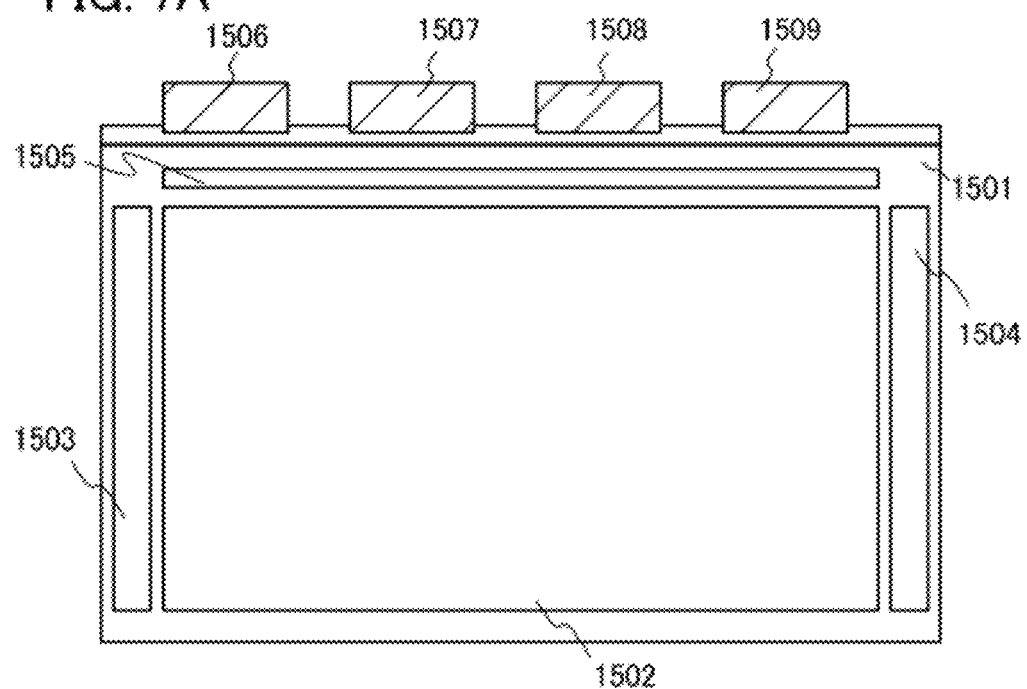
FIGS. 7A and 7B each illustrate an embodiment of an EL display device according to an embodiment of the present invention.

An embodiment of the present invention will be described with reference to FIGS. 7A and 7B. FIG. 7A illustrates a display device including a pixel portion 1502, a scan line driver circuit 1503, a power supply line driver circuit 1504, and an analog switch 1505 for driving a signal line, over a glass substrate 1501. FIG. 7A is an example in which the analog switch 1505 is used for driving the signal line. In addition, an FPC 1506, an FPC 1507, an FPC 1508, and an FPC 1509 are illustrated in FIG. 7A.

Figure 7B:
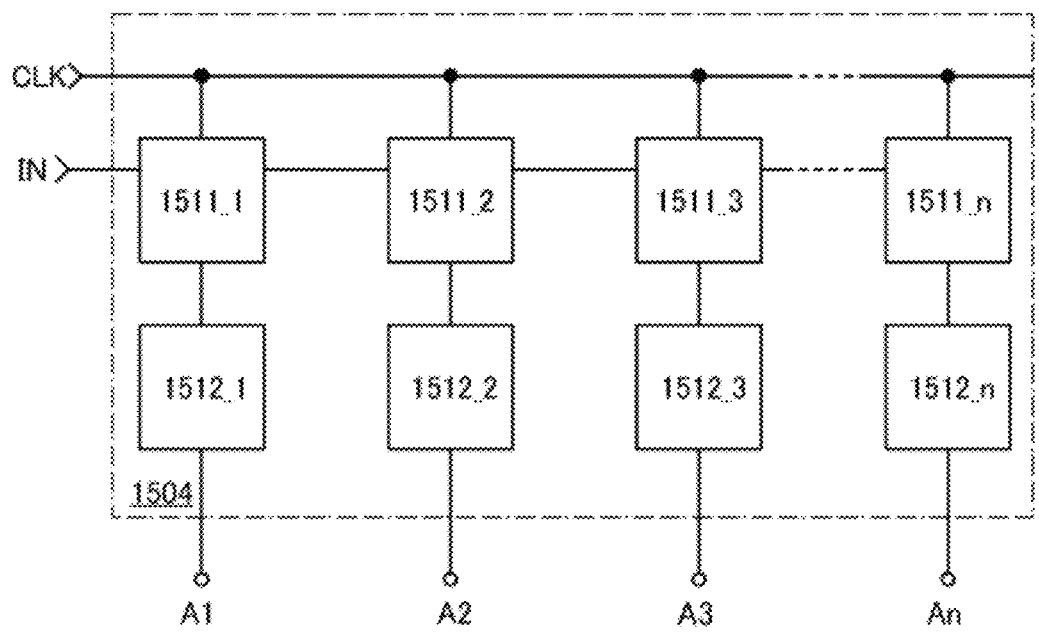

FIG. 7B is a block diagram of the power supply line driver circuit 1504. The power supply line driver circuit 1504 includes shift registers 1511_1 to 1511_$n$ and inverters 1512_1 to 1512_$n$. The inverters 1512_1 to 1512_$n$ are used for driving power supply lines A1 to An, respectively.

Figure 8A:
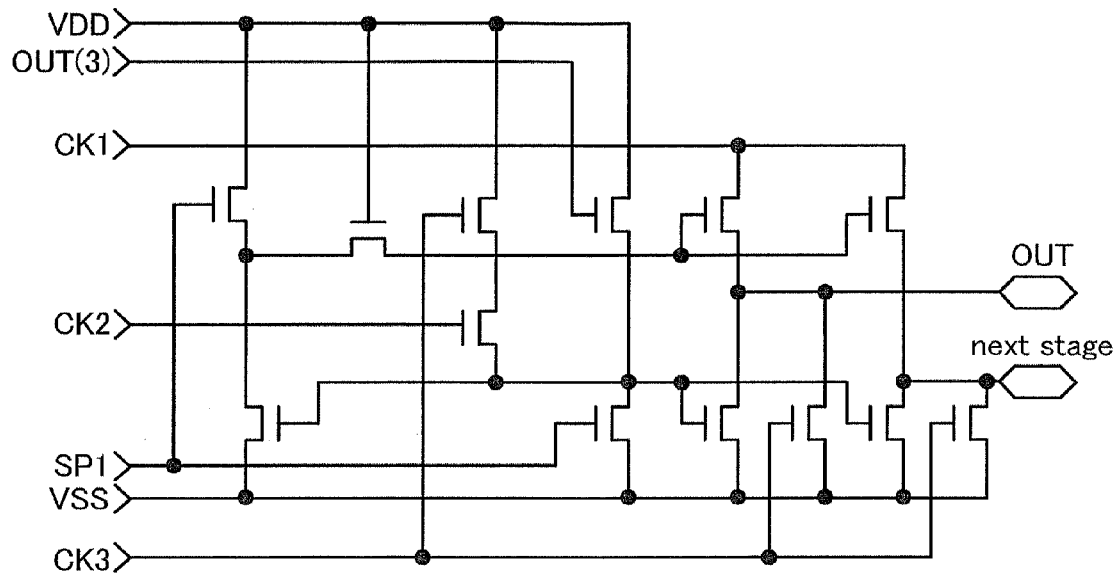
FIGS. 8A and 8B each illustrate an embodiment of an EL display device according to an embodiment of the present invention.

The shift registers 1511 can be obtained by connecting plural stages of known circuits each illustrated in FIG. 8A in a cascade. Japanese Published Patent Application No. 2011-030171 may be referred to for the operation of the circuit illustrated in FIG. 8A.

Figure 8B:
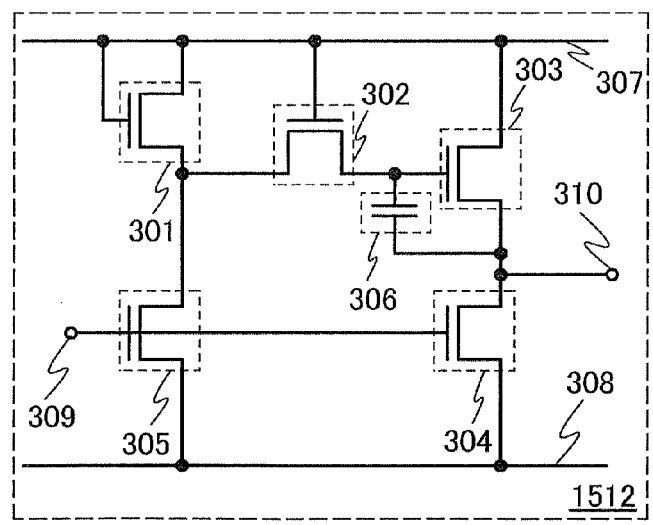

FIG. 8B is a circuit diagram of the inverter 1512. In FIG. 8B, a high power supply potential $V_{DD}$ is supplied to a power supply line 307, and a low power supply potential $V_{SS}$ is supplied to a power supply line 308.

The operation of the circuit illustrated in FIG. 8B is described. In FIG. 8B, a signal OUT from the shift register is input to a terminal 309. The potential of the terminal 309 generally has a level of an L signal and has a level of an H signal by a pulse signal from the signal OUT.

First, when the H signal is input to the terminal 309, field-effect transistors, an FET 304 and an FET 305, are brought into a conduction state. Thus, source potentials of an FET 301 and an FET 303 have a level of an L signal. A terminal 310 is connected to the power supply line 308, and the terminal 310 has a level of an L signal in this state and pixels are initialized.

Then, when the terminal 309 has a level of an L signal, the FET 304 and the FET 305 are brought into a non-conduction state, and the source potential of the FET 301 is increased. A gate potential of the FET 303 is also increased through an FET 302, so that the FET 303 is brought into a conduction state. Current flows from the power supply line 307 to the terminal 310 through the FET 303, so that the potential of the terminal 310 is increased. A capacitor 306 functions so as to perform bootstrap operation, and thus, the gate potential of the FET 303 is increased to exceed the potential of the power supply line 307, and the potential of the terminal 310 is increased to the potential of the power supply line 307. At this time, current flows from the terminal 310 to EL elements in the pixels, so that the EL elements emit light.

For example, in the case where a 13-inch EL display device emits light at a luminance of 500 cd/m$^2$, the total amount of current flowing to EL elements in all the pixels is greater than or equal to 1 A. When the display has a resolution equal to that of full high vision (1920×1080), there are 1080 rows of pixels, and current flowing to a power supply line for one row is greater than or equal to 0.9 mA. Since the current flowing to a power supply line for one row is current flowing through the FET 303, potential drop depending on the resistance (ON resistance) of the FET 303 which is in a conduction state occurs between a drain and a source of the FET 303. If the amount of this potential drop is 0.1 V at maximum, the ON resistance of the FET 303 needs to be lower than or equal to 110Ω.

In the case where the FET 303 includes an In—Ga—Zn-based oxide film which is not highly purified, the following calculation is possible.

The ON resistance $R_{on}$ can be expressed as Formula (6) assuming that in the FET 303, the thickness of the gate insulating layer is 300 nm, the relative dielectric constant is 3.8, voltage $V_{gs}$ between the gate and the source is 5 V, the threshold voltage $V_{th}$ is 2 V, the field-effect mobility μ is 10 cm$^2$/Vs, and the gate length L is 3 μm.

$$R_{in}=V_{ds}/I_d \quad (6)$$

The drain current $I_d$ in Formula (6) is expressed as Formula (7).

$$I_d=\mu \cdot C_o \cdot W/L \cdot (V_{gs}-V_{th}) \cdot V_{ds} \quad (7)$$

$C_o$ is electrostatic capacitance of the gate insulating layer per unit area, W is the gate width, L is the gate length, and $V_{ds}$ is a voltage between the drain and the source.

From Formula (6) and Formula (7), W needs to be 9 cm so that the ON resistance can be lower than or equal to 110Ω. However, the frame of the display is expected to be small, so that W=9 cm is not realistic for a product. That is, the ON resistance cannot be lower than or equal to 110Ω with an In—Ga—Zn-based oxide film which is an oxide semiconductor film whose field-effect mobility μ is 10 cm$^2$/Vs and which is not highly purified. Amorphous silicon has yet lower mobility, so that the ON resistance cannot be lower than or equal to 110Ω.

On the other hand, in an In—Sn—Zn-based oxide film which is highly purified, the field-effect mobility μ can be higher than or equal to 80 cm$^2$/Vs, further higher than or equal to 120 cm$^2$/Vs. In that case, with the above conditions, W can be 11.3 mm, further 7.5 mm, which can be used for the frame of the display.

In this manner, when a highly purified oxide semiconductor film is used for an active layer of the FET, a power supply line driver circuit can be formed over an insulating substrate together with a circuit such as a pixel or the like. In addition, when the highly purified oxide semiconductor film is used for an active layer of the FET, in an EL display device, variation in characteristics of the FET such as threshold voltage can be suppressed, or deterioration of the EL element over time can be compensated.

In FIG. 7A, the analog switch 1505 is used for driving the signal line. For example, in the case of a full high vision EL display device, there are 5760 (1920>RGB) signal lines. When the signal line driver circuit is not formed over the same substrate as the signal lines, terminals of the signal line driver circuit are connected to terminals connected to the signal lines. Therefore, there is a problem in that a contact failure of the terminal easily occurs owing to mechanical impact or the like. In this case, a reduction in the number of terminals is effective for less contact failure. Accordingly, an object is to reduce the number of terminals by forming an analog switch array over the same substrate as the signal lines and selectively connecting terminals for RGB to the signal line driver circuit in a time division manner.

Figure 9:
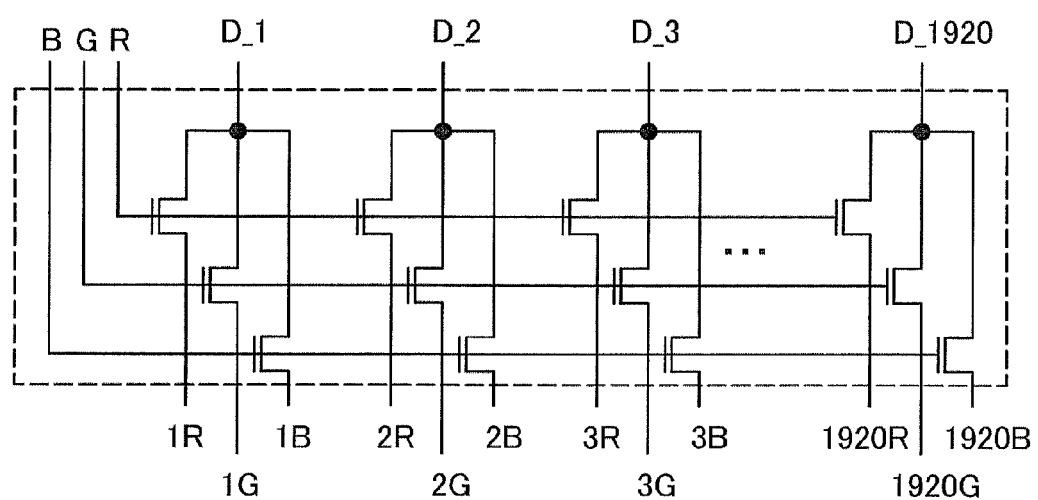
FIG. 9 illustrates an embodiment of an EL display device according to an embodiment of the present invention.

FIG. 9 illustrates an equivalent circuit of the analog switch 1505. In an example illustrated in FIG. 9, 1920 output terminals D_1 to D_1920 of the signal line driver circuit and 3 terminals for RGB controlling gates of a switch array bring the number of terminals connected to the outside of the EL display device to 1923 in total, which is approximately one third of the number of such terminals in the case where the switch array is not used. Such terminals are connected to the FPCs 1506 to 1509. Meanwhile, as compared to the case of performing time division, the source driver connected to the analog switch needs to operate three times faster and time for writing into signal lines needs to be reduced to one third. In order to reduce time for writing into signal lines, it is important to improve current capability of transistors used for the analog switch. Therefore, as in the case of the power supply line driver circuit, a transistor whose field-effect mobility is high and which includes a highly purified oxide semiconductor film for an active layer is preferably included in the analog switch.

Figure 10:
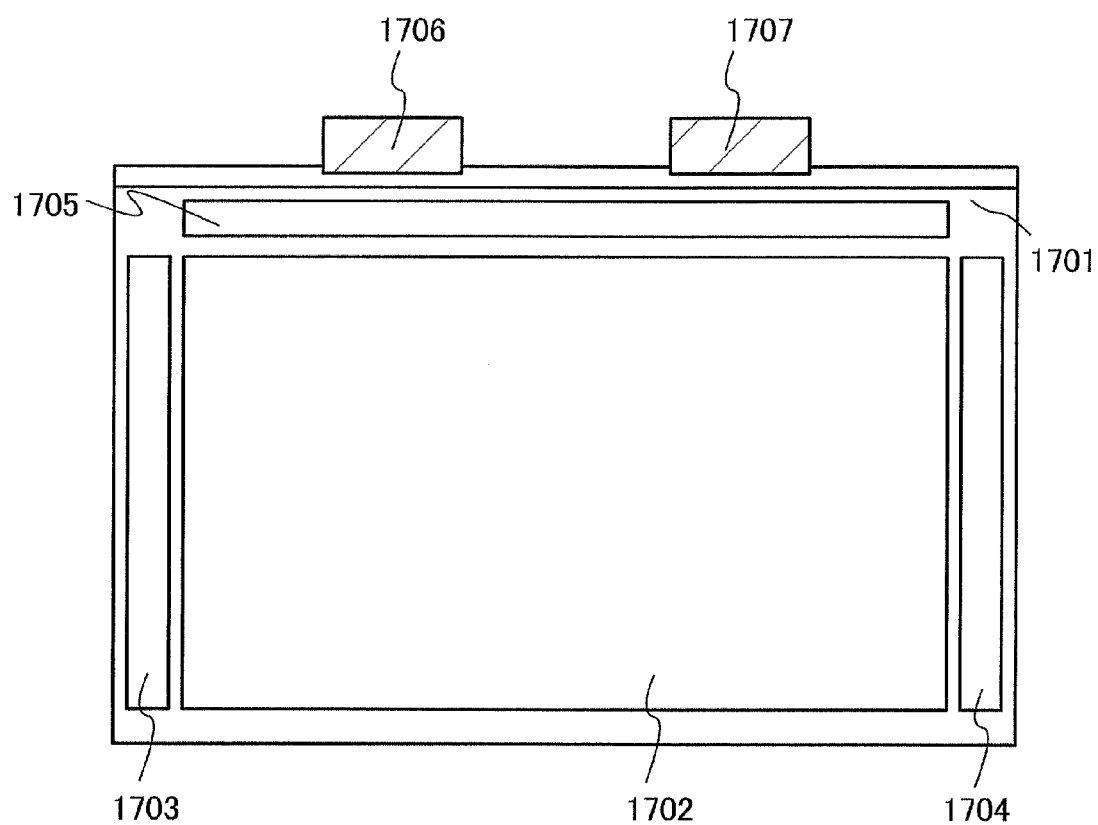
FIG. 10 illustrates an embodiment of an EL display device according to an embodiment of the present invention.

As illustrated in FIG. 10, a signal line driver circuit can be formed over an insulating substrate where a circuit such as a pixel is formed. FIG. 10 illustrates an example in which a pixel portion 1702, a scan line driver circuit 1703, a power supply line driver circuit 1704, and a signal line driver circuit 1705 are formed over a glass substrate 1701. Signals are supplied from an FPC 1706 and an FPC 1707 to the scan line driver circuit 1703, the power supply line driver circuit 1704, and the signal line driver circuit 1705.

As described above, the power supply line driver circuit of this embodiment includes a transistor including a highly purified oxide semiconductor for a channel formation region. The transistor including a highly purified oxide semiconductor for a channel formation region can have high field-effect mobility. Thus, by using the transistor, an EL display device in which a power supply line driver circuit is formed over an insulating substrate where a pixel portion is formed can be provided. Consequently, an EL display device with a narrow frame can be provided.

This embodiment can be implemented in appropriate combination with any of the structures described in the other embodiments.

Embodiment 2

In this embodiment, an example of a method for manufacturing a transistor included in the power supply line driver circuit described in Embodiment 1 will be described with reference to FIGS. 11A to 11D and FIGS. 12A to 12D. In addition, examples of a top view and a cross-sectional view corresponding to the top view of a sampling transistor in each pixel in a pixel portion will be described with reference to FIGS. 13A and 13B and FIGS. 14A and 14B. The sampling transistor can be manufactured together with the transistor included in the power supply line driver circuit.

In this embodiment, an example of manufacturing a bottom gate transistor is described; however, a top gate transistor can also be used for forming the power supply line driver circuit and the pixel. In addition, an example of manufacturing a staggered transistor is described in this embodiment, but a coplanar transistor can also be used.

In this embodiment, an example of manufacturing a transistor included in the power supply line driver circuit is described; however, a transistor included in the signal line driver circuit and/or the scan line driver circuit can be formed in a similar manner.

FIGS. 11A to 11D illustrate an example of manufacturing a channel-etched bottom gate transistor.

First, a conductive film is formed over a substrate 400 which is a substrate having an insulating surface, and then, a gate electrode layer 401 is provided using a photolithography process with the use of a photomask.

As the substrate 400, a glass substrate which enables mass production is preferably used. As a glass substrate used for the substrate 400, a glass substrate whose strain point is higher than or equal to 730° C. may be used when the temperature of heat treatment to be performed in a later step is high. For the substrate 400, for example, a glass material such as aluminosilicate glass, aluminoborosilicate glass, or barium borosilicate glass is used.

An insulating layer serving as a base layer may be provided between the substrate 400 and the gate electrode layer 401. The base layer has a function of preventing diffusion of an impurity element from the substrate 400, and can be formed with a single-layer or stacked-layer structure using one or more of silicon nitride, silicon oxide, silicon nitride oxide, and silicon oxynitride.

Silicon oxynitride refers to a substance that contains a larger amount of oxygen than that of nitrogen. For example, silicon oxynitride contains oxygen, nitrogen, silicon, and hydrogen at concentrations of higher than or equal to 50 at. % and lower than or equal to 70 at. %, higher than or equal to 0.5 at. % and lower than or equal to 15 at. %, higher than or equal to 25 at. % and lower than or equal to 35 at. %, and higher than or equal to 0 at. % and lower than or equal to 10 at. %, respectively. In addition, silicon nitride oxide refers to a substance that contains a larger amount of nitrogen than that of oxygen. For example, silicon nitride oxide contains oxygen, nitrogen, silicon, and hydrogen at concentrations of higher than or equal to 5 at. % and lower than or equal to 30 at. %, higher than or equal to 20 at. % and lower than or equal to 55 at. %, higher than or equal 25 at. % and lower than or equal to 35 at. %, and higher than or equal to 10 at. % and lower than or equal to 25 at. %, respectively. Note that the above ranges are obtained in the case where measurement is performed using Rutherford backscattering spectrometry (RBS) and hydrogen forward scattering spectrometry (HFS). Moreover, the total of the percentages of the constituent elements does not exceed 100 at. %.

The gate electrode layer 401 may be formed to have a single-layer or stacked-layer structure using one or more of the following materials: Al, Ti, Cr, Co, Ni, Cu, Y, Zr, Mo, Ag, Ta, and W, a nitride of any of these elements, an oxide of any of these elements, and an alloy of any of these elements. Alternatively, an oxide or an oxynitride which contains at least In and Zn may be used. For example, an In—Ga—Zn—O—N-based oxide or the like can be used.

Next, a gate insulating layer 402 is formed over the gate electrode layer 401. The gate insulating layer 402 is formed by a sputtering method, an evaporation method, a plasma-enhanced chemical vapor deposition (PCVD) method, a pulsed laser deposition (PLD) method, an atomic layer deposition (ALD) method, a molecular beam epitaxy (MBE) method, or the like without exposure to the air after the gate electrode layer 401 is formed.

It is preferable that an insulating film from which oxygen is released by heat treatment be used as the gate insulating layer 402.

To release oxygen by heat treatment means that the released amount of oxygen which is converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis.

Here, a method in which the amount of released oxygen is measured by conversion into oxygen atoms using TDS analysis will be described.

The amount of released gas in TDS analysis is proportional to the integral value of a spectrum. Therefore, the amount of released gas can be calculated from the ratio between the integral value of a measured spectrum and the reference value of a standard sample. The reference value of a standard sample refers to the ratio of the density of a predetermined atom contained in a sample to the integral value of a spectrum.

For example, the amount of the released oxygen molecules ($N_{O2}$) from an insulating film can be obtained according to Formula (8) with the TDS analysis results of a silicon wafer containing hydrogen at a predetermined density which is the standard sample and the TDS analysis results of the insulating film. Here, all spectra having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

$$N_{O2} = \frac{N_{H2}}{S_{H2}} \times S_{O2} \times \alpha \qquad (8)$$

In Formula (8), $N_{H2}$ is the value obtained by conversion of the amount of hydrogen molecules released from the standard sample into density. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. α is a coefficient affecting the intensity of the spectrum in the TDS analysis. Refer to Japanese Published Patent Application No. H6-275697 for details of the Formula (8). Note that the amount of released oxygen from the above insulating film is measured with a thermal desorption spectroscopy apparatus produced by ESCO Ltd., EMD-WA1000S/W, using a silicon wafer containing hydrogen atoms at $1\times10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen when converted into oxygen atoms is twice the amount of the released oxygen molecules.

In the above structure, the film from which oxygen is released by heat treatment may be oxygen-excess silicon oxide (SiO$_x$ (X>2)). In the oxygen-excess silicon oxide (SiO$_x$ (X>2)), the number of oxygen atoms per unit volume is more than twice the number of silicon atoms per unit volume. The number of silicon atoms and the number of oxygen atoms per unit volume are measured by Rutherford backscattering spectrometry.

Oxygen is supplied from the gate insulating layer 402 to an oxide semiconductor film in contact with the gate insulating layer 402, whereby interface states between the oxide semiconductor film and the gate insulating layer 402 which are in contact with each other can be reduced. As a result, carrier trapping, occurring due to an operation of the transistor or the like, at the interface between the oxide semiconductor film and the gate insulating layer 402 which are in contact with each other can be suppressed, and thus, a transistor with less deterioration in electric characteristics can be obtained.

Further, in some cases, electric charge is generated owing to an oxygen vacancy in the oxide semiconductor film in contact with the gate insulating layer. In general, part of oxygen vacancies in an oxide semiconductor film serves as a donor and causes release of an electron which is a carrier. As a result, the threshold voltage of a transistor shifts in the negative direction. In view of this, when oxygen is sufficiently supplied from the gate insulating layer 402 to the oxide semiconductor film provided in contact with the gate insulating layer 402 and the oxide semiconductor film provided in contact with the gate insulating layer 402 preferably contains excess oxygen, oxygen vacancies in the oxide semiconductor film which cause the negative shift of the threshold voltage can be reduced.

For easier crystal growth in the oxide semiconductor film in contact with the gate insulating layer 402, it is preferable that the gate insulating layer 402 be sufficiently flat.

The gate insulating layer 402 may be formed to have a single-layer or stacked-layer structure, using one or more of silicon oxide, silicon oxynitride, silicon nitride oxide, silicon nitride, aluminum oxide, aluminum nitride, hafnium oxide, zirconium oxide, yttrium oxide, lanthanum oxide, cesium oxide, tantalum oxide, and magnesium oxide.

The gate insulating layer 402 is formed preferably by a sputtering method in an oxygen gas atmosphere at a substrate heating temperature of higher than or equal to room temperature and lower than or equal to 200° C., preferably higher than or equal to 50° C. and lower than or equal to 150° C. Note that an oxygen gas to which a rare gas is added may be used. In that case, the percentage of the oxygen gas is higher than or equal to 30 vol. %, preferably higher than or equal to 50 vol. %, more preferably higher than or equal to 80 vol. %. The thickness of the gate insulating layer 402 is greater than or equal to 100 nm and less than or equal to 1000 nm, preferably greater than or equal to 200 nm and less than or equal to 700 nm Lower substrate heating temperature at the time of film formation, higher percentage of an oxygen gas in a film formation atmosphere, or a larger thickness of the gate insulating layer 402 leads to a larger amount of oxygen that is released at the time of performing heat treatment on the gate insulating layer 402. The concentration of hydrogen in the film can be more reduced by a sputtering method than a PCVD method. Note that the thickness of the gate insulating layer 402 is set such that the productivity is not reduced, although can be greater than 1000 nm.

Then, an oxide semiconductor film 403 is formed by a sputtering method, an evaporation method, a PCVD method, a PLD method, an ALD method, an MBE method, or the like over the gate insulating film 402. The above steps correspond to the cross-sectional view illustrated in FIG. 11A.

The thickness of the oxide semiconductor film 403 is greater than or equal to 1 nm and less than or equal to 40 nm, preferably greater than or equal to 3 nm and less than or equal to 20 nm In particular, in the case where the transistor has a channel length of less than or equal to 30 nm and the oxide semiconductor film 403 has a thickness of around 5 nm, a short channel effect can be suppressed and stable electric characteristics can be obtained.

In particular, when the oxide semiconductor film 403 is formed using an In—Sn—Zn-based material, a transistor having high field-effect mobility can be obtained.

As for the oxide semiconductor film 403, a material which has a band gap of greater than or equal to 2.5 eV, preferably greater than or equal to 2.8 eV, more preferably greater than or equal to 3.0 eV is selected in order to reduce the off-state current of the transistor. With the use of the oxide semiconductor film 403 with a band gap in the above range, the off-state current of the transistor can be reduced.

In the oxide semiconductor film 403, preferably, hydrogen, an alkali metal, an alkaline earth metal, and the like are reduced and the concentration of impurities is very low. When the oxide semiconductor film 403 contains any of the above impurities, recombination in a band gap occurs owing to a level formed by the impurity, so that the transistor has increased off-state current.

Specifically, the concentration of hydrogen in the oxide semiconductor film 403, which is measured by secondary ion mass spectrometry (SIMS), is lower than $5\times10^{19}$ cm$^{-3}$, preferably lower than or equal to $5\times10^{18}$ cm$^{-3}$, more preferably lower than or equal to $1\times10^{18}$ cm$^{-3}$, still more preferably lower than or equal to $5\times10^{17}$ cm$^{-3}$.

Further, as for alkali metal concentration in the oxide semiconductor film 403, which is measured by SIMS, the concentration of sodium is lower than or equal to $5\times10^{16}$ cm$^{-3}$, preferably lower than or equal to $1\times10^{16}$ cm$^{-3}$, more preferably lower than or equal to $1\times10^{15}$ cm$^{-3}$. The concentration of lithium is lower than or equal to $5\times10^{15}$ cm$^{-3}$, preferably lower than or equal to $1\times10^{15}$ cm$^{-3}$. The concentration of potassium is lower than or equal to $5\times10^{15}$ cm$^{-3}$, preferably lower than or equal to $1\times10^{15}$ cm$^{-3}$.

The oxide semiconductor film 403 is preferably formed by a sputtering method in an oxygen gas atmosphere at a substrate heating temperature of higher than or equal to 100° C. and lower than or equal to 600° C., preferably higher than or equal to 150° C. and lower than or equal to 550° C., more preferably higher than or equal to 200° C. and lower than or equal to 500° C. The thickness of the oxide semiconductor film 403 is greater than or equal to 1 nm and less than or equal to 40 nm, preferably greater than or equal to 3 nm and less than or equal to 20 nm. As the substrate heating temperature at the time of film formation is higher, the impurity concentration in the obtained oxide semiconductor film 403 is lower. In addition, an atomic arrangement in the oxide semiconductor film 403 is ordered, and the density thereof is increased, so that a polycrystalline oxide semiconductor film or a CAAC-OS film can easily be formed. Furthermore, when an oxygen gas atmosphere is employed for the deposition, an unnecessary atom such as a rare gas atom is not contained in the oxide semiconductor film 403, so that a polycrystalline oxide semiconductor film or a CAAC-OS film is likely to be formed. A mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %.

As the oxide semiconductor film 403 is thinner, the short-channel effect of the transistor can be reduced. However, when the oxide semiconductor film 403 is too thin, the oxide semiconductor film 403 is significantly influenced by interface scattering; thus, the field-effect mobility might be decreased.

In the case of forming a film of an In—Sn—Zn-based oxide as the oxide semiconductor film 403 by a sputtering method, it is preferable to use an In—Sn—Zn—O target having an atomic ratio of In:Sn:Zn=2:1:3, 1:2:2, 1:1:1, or 20:45:35. When the oxide semiconductor film 403 is formed using an In—Sn—Zn—O target having the aforementioned composition ratio, a polycrystalline oxide semiconductor film or CAAC-OS film is easily formed.

Next, first heat treatment is performed. The first heat treatment is performed in a reduced pressure atmosphere, an inert atmosphere, or an oxidizing atmosphere. By the first heat treatment, the impurity concentration in the oxide semiconductor film 403 can be reduced. The above steps correspond to the cross-sectional view illustrated in FIG. 11B.

The first heat treatment is preferably performed in such a manner that heat treatment in a reduced pressure atmosphere or an inert gas atmosphere is completed and then, the atmosphere is changed to an oxidizing atmosphere while the temperature is kept, and heat treatment is further performed. When the heat treatment is performed in a reduced pressure atmosphere or an inert atmosphere, the impurity concentration in the oxide semiconductor film 403 can be effectively reduced; however, oxygen vacancies are caused at the same time. By the heat treatment in the oxidizing atmosphere, the caused oxygen vacancies can be reduced.

By performing the first heat treatment on the oxide semiconductor film 403 in addition to the substrate heating in deposition, the impurity levels in the film can be significantly reduced. Accordingly, the field-effect mobility of the transistor can be increased so as to be close to ideal field-effect mobility to be described later.

The oxide semiconductor film 403 may be crystallized in the following manner: oxygen ions are implanted into the oxide semiconductor film 403, impurities such as hydrogen included in the oxide semiconductor film 403 are released by heat treatment, and the oxide semiconductor film 403 is crystallized through the heat treatment or by another heat treatment performed later.

Further, the oxide semiconductor film 403 may be selectively crystallized not by the first heat treatment but by irradiation with a laser beam. Alternatively, it is also possible that the oxide semiconductor film 403 is selectively crystallized by irradiation with a laser beam while the first heat treatment is performed. Laser beam irradiation is performed in an inert atmosphere, an oxidizing atmosphere, or a reduced-pressure atmosphere. When laser beam irradiation is performed, a continuous wave (CW) laser beam or a pulsed laser beam can be used. For example, it is possible to use a gas laser beam such as an Ar laser beam, a Kr laser beam, or an excimer laser beam; a laser beam using, as a medium, single crystal or polycrystalline YAG, YVO$_4$, forsterite (Mg$_2$SiO$_4$), YAlO$_3$, or GdVO$_4$ doped with one or more of Nd, Yb, Cr, Ti, Ho, Er, Tm, and Ta as a dopant; a solid-state laser beam such as a glass laser beam, a ruby laser beam, an alexandrite laser beam, or a Ti:sapphire laser beam; or a vapor laser beam emitted using one or both of a copper vapor laser and a gold vapor laser. By irradiation with the fundamental harmonic of such a laser beam or any of the second harmonic to the fifth harmonic of the fundamental harmonic of the laser beam, the oxide semiconductor film 403 can be crystallized. Note that it is preferable to use a laser beam having larger energy than a band gap of the oxide semiconductor film 403. For example, a laser beam emitted from a KrF, ArF, XeCl, or XeF excimer laser may be used. Note that the shape of the laser beam may be linear.

Note that laser beam irradiation may be performed plural times under different conditions. For example, it is preferable that first laser beam irradiation is performed in a rare gas atmosphere or a reduced-pressure atmosphere, and second laser beam irradiation is performed in an oxidizing atmosphere because in that case, high crystallinity can be obtained while oxygen vacancies in the oxide semiconductor film 403 are reduced.

Then, the oxide semiconductor film 403 is processed into an island shape by a photolithography process or the like, so that an oxide semiconductor film 404 is formed.

Then, after a conductive film is formed over the gate insulating layer 402 and the oxide semiconductor film 404, a source electrode 405A and a drain electrode 405B are formed through a photolithography process or the like. The conducive film may be formed by a sputtering method, an evaporation method, a PCVD method, a PLD method, an ALD method, an MBE method, or the like. The source electrode 405A and the drain electrode 405B may be formed as in the case of the gate electrode layer 401 to have a single-layer structure or a stacked-layer structure using one or more of the following materials: Al, Ti, Cr, Co, Ni, Cu, Y, Zr, Mo, Ag, Ta, and W, a nitride of any of these elements, an oxide of any of these elements, and an alloy of any of these elements.

Then, an insulating film 406 to be an upper insulating film is formed by a sputtering method, an evaporation method, a PCVD method, a PLD method, an ALD method, an MBE method, or the like. The above steps correspond to the cross-sectional view illustrated in FIG. 11C. The insulating film 406 may be formed by a method similar to that of the gate insulating layer 402.

A protective insulating film may be formed to be stacked over the insulating film 406 (not illustrated). It is preferable that the protective insulating film be a film through which oxygen does not pass even when heat treatment at a temperature of higher than or equal to 250° C. and lower than or equal to 450° C., preferably higher than or equal to 150° C. and lower than or equal to 800° C. is performed for one hour, for example.

In the case where the protective insulating film with such a property is provided in the periphery of the insulating film 406, oxygen released from the insulating film 406 by heat treatment can be inhibited from diffusing toward the outside of the transistor. Since oxygen is held in the insulating film 406 in this manner, the field-effect mobility of the transistor can be prevented from decreasing, variation in the threshold voltage can be reduced, and the reliability can be improved.

The protective insulating film may be formed to have a single-layer structure or a stacked-layer structure including at least one of silicon nitride oxide, silicon nitride, aluminum oxide, aluminum nitride, hafnium oxide, zirconium oxide, yttrium oxide, lanthanum oxide, cesium oxide, tantalum oxide, and magnesium oxide.

After the insulating film 406 is formed, second heat treatment is performed. The above steps correspond to the cross-sectional view illustrated in FIG. 11D. The second heat treatment is performed at a temperature of higher than or equal to 150° C. and lower than or equal to 550° C., preferably higher than or equal to 250° C. and lower than or equal to 400° C. in a reduced pressure atmosphere, an inert atmosphere, or an oxidation atmosphere. By the second heat treatment, oxygen is released from the gate insulating layer 402 and the insulating film 406, so that oxygen vacancies in the oxide semiconductor film 404 can be reduced. In addition, interface states between the gate insulating layer 402 and the oxide semiconductor film 404 and interface states between the oxide semiconductor film 404 and the insulating film 406 can be reduced, so that variation in threshold voltage of the transistor can be reduced, and the reliability thereof can be improved.

Figure 6A:
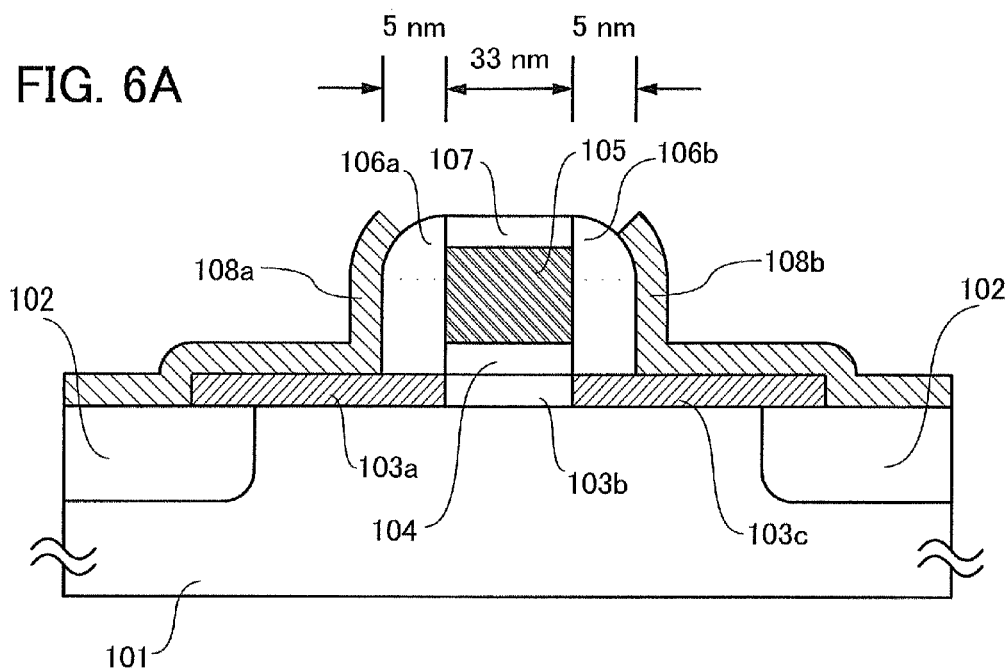
FIGS. 6A and 6B illustrate cross-sectional structures of transistors used for calculation.
Figure 6B:
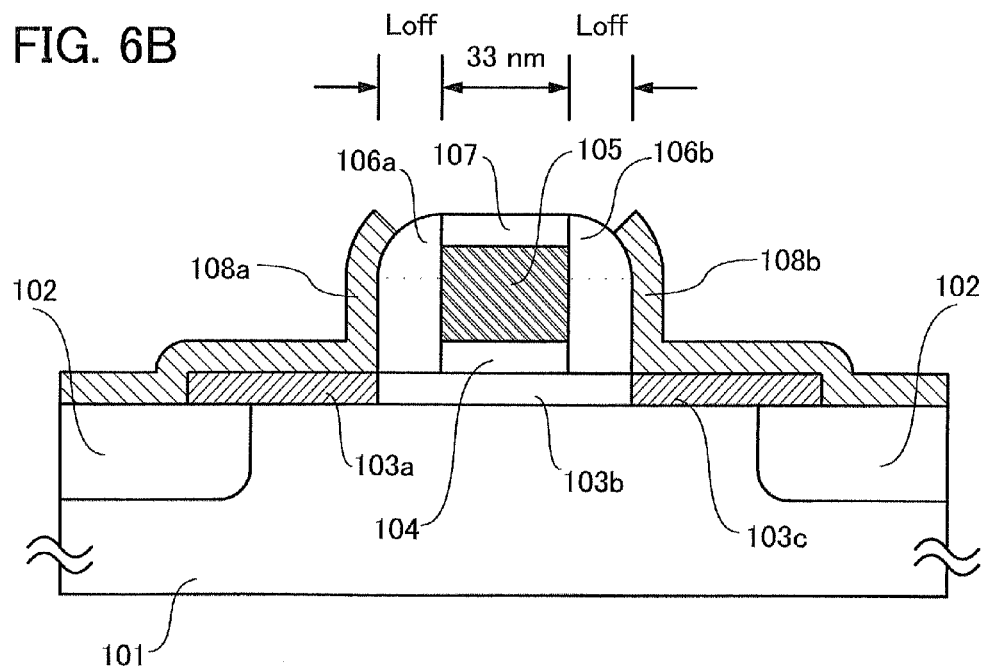
Figure 11A:
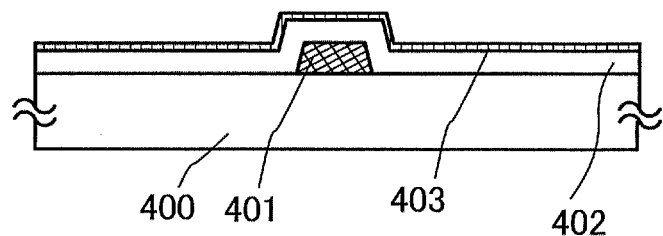
FIGS. 11A to 11D are cross-sectional views illustrating a method for manufacturing a transistor according to an embodiment of the present invention.
Figure 11B:
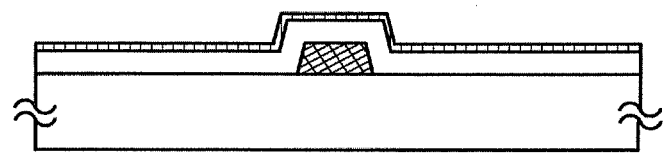
Figure 11C:
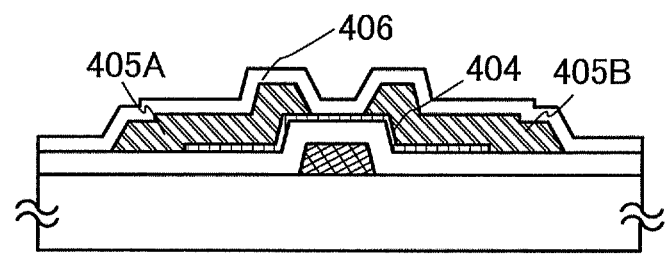
Figure 11D:
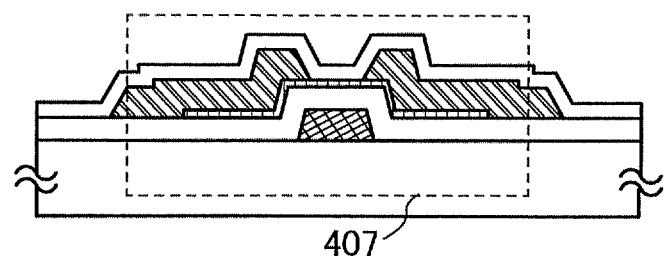

Although the transistor illustrated in FIG. 11D has a bottom gate structure, it has a structure equivalent to the structures of the transistors illustrated in FIGS. 6A and 6B. That is, the semiconductor region 103b overlapping with the gate 105 in FIGS. 6A and 6B corresponds to the oxide semiconductor film 404 in FIG. 11D. In addition, the semiconductor region 103a and the semiconductor region 103c having $n^+$-type conductivity in FIGS. 6A and 6B corresponds to a contact region of the source electrode 405A and the oxide semiconductor film 404 and a contact region of the drain electrode 405B and the oxide semiconductor 404 in FIG. 11D. Thus, when interface states between the gate insulating layer 402 and the oxide semiconductor film 404 and interface states between the oxide semiconductor film 404 and the insulating film 406 are reduced, high field-effect mobility as in the result of the calculation can be obtained.

The transistor including the oxide semiconductor film 404 subjected to the first heat treatment and the second heat treatment has high field-effect mobility and a small off-state current. Specifically, the field-effect mobility of the transistor can be higher than or equal to 80 cm$^2$/Vs, preferably higher than or equal to 120 cm$^2$/Vs, and the off-state current per micrometer of the channel width can be lower than or equal to $1\times10^{-18}$ A, lower than or equal to $1\times10^{-21}$ A, or lower than or equal to $1\times10^{-24}$ A.

The oxide semiconductor film 404 is preferably non-single-crystal. If operation of the transistor or light or heat from the outside causes oxygen vacancies in the oxide semiconductor film 404 which is completely single crystal, a carrier due to the oxygen vacancy is generated in the oxide semiconductor film 404 owing to the absence of oxygen between lattices which compensate the oxygen vacancy; as a result, the threshold voltage of the transistor shifts in the negative direction in some cases.

The oxide semiconductor film 404 preferably has crystallinity. For example, a polycrystalline oxide semiconductor film or a CAAC-OS film is used.

Through the above-described steps, the transistor 407 illustrated in FIG. 11D can be manufactured.

As another structural example, an example in which a channel-stop bottom gate transistor is manufactured is described with reference to FIGS. 12A to 12D.

The transistor illustrated in FIGS. 12A to 12D is different from the transistor in FIGS. 11A to 11D in that it includes an insulating film 408 serving as a channel-stop film. In the description of FIGS. 12A to 12D, description of part in common to FIGS. 11A to 11D is omitted and for the common part, the description of FIGS. 11A to 11D may be referred to.

Figure 12A:
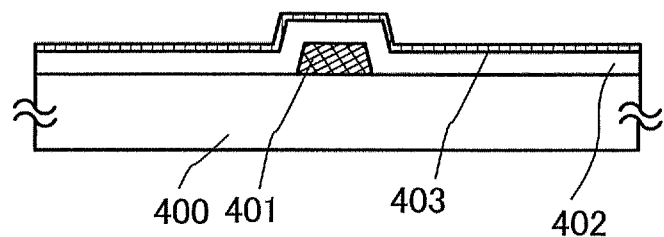
FIGS. 12A to 12D are cross-sectional views illustrating a method for manufacturing a transistor according to an embodiment of the present invention.
Figure 12B:
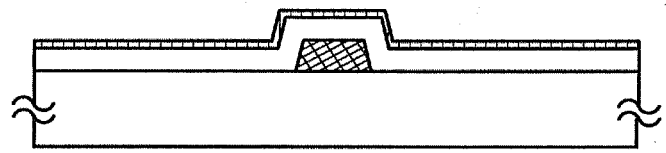
Figure 12C:
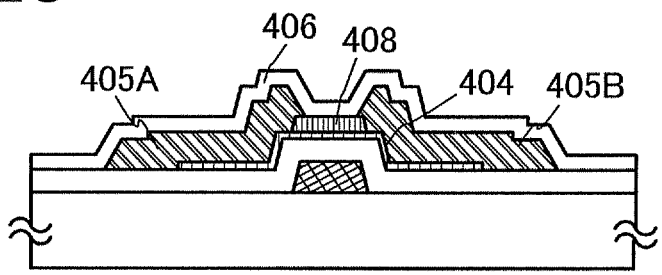

Description about FIGS. 12A and 12B is similar to that about FIGS. 11A and 11B. The insulating film 408 illustrated in FIG. 12C can be formed in a manner similar to that of the gate insulating layer 402 and the insulating film 406. That is, the insulating film 408 is preferably formed using an insulating film from which oxygen is released by heat treatment.

By providing the insulating film 408 serving as a channel-stop film, the oxide semiconductor film 404 can be prevented from being etched when the source electrode 405A and the drain electrode 405B are formed by a photolithography process or the like.

Figure 12D:
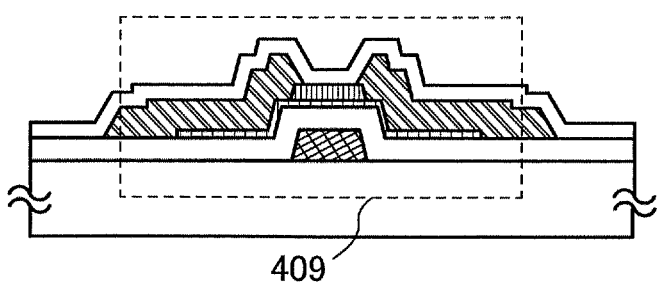

Like the insulating film 406, oxygen is released from the insulating film 408 by the second heat treatment which is performed after the insulating film 406 illustrated in FIG. 12D is formed. Therefore, an effect of reducing oxygen vacancies in the oxide semiconductor film 404 can be improved. In addition, interface states between the gate insulating layer 402 and the oxide semiconductor film 404 and interface states between the oxide semiconductor film 404 and the insulating film 408 can be reduced, so that variation in threshold voltage of the transistor can be reduced, and the reliability thereof can be improved.

Through the above-described steps, a transistor 409 illustrated in FIG. 12D can be manufactured.

Figure 13A:
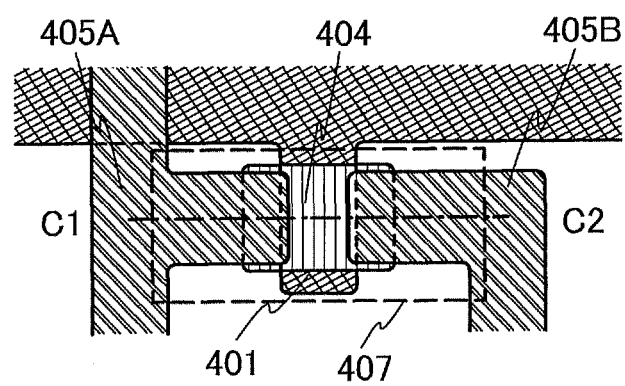
FIGS. 13A and 13B are a top view and a cross-sectional view of a transistor according to an embodiment of the present invention.
Figure 13B:
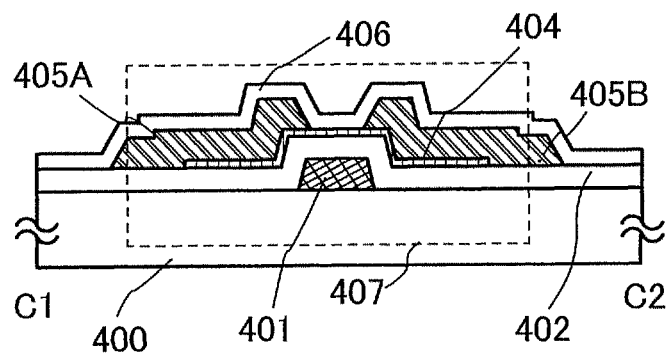

FIG. 13A is a top view of the case where a channel-etched bottom gate transistor is applied to a sampling transistor of a pixel. FIG. 13B is a cross-sectional view taken along chain line C1-C2 in the top view of FIG. 13A.

The cross-sectional view of FIG. 13B can be described as in the case of the channel-etched bottom gate transistor illustrated in FIGS. 11A to 11D. The top view of the sampling transistor of the pixel illustrated in FIG. 13A can also be similarly described. For example, in a pixel portion, a signal line corresponds to the source electrode 405A and a scan line corresponds to the gate electrode layer 401, and a channel formation region corresponds to the oxide semiconductor film 404. An electrode extending from the sampling transistor to the driving transistor corresponds to the drain electrode 405B.

As described above, the channel-etched bottom gate transistor 407 can be applied to the sampling transistor of the pixel.

Figure 14A:
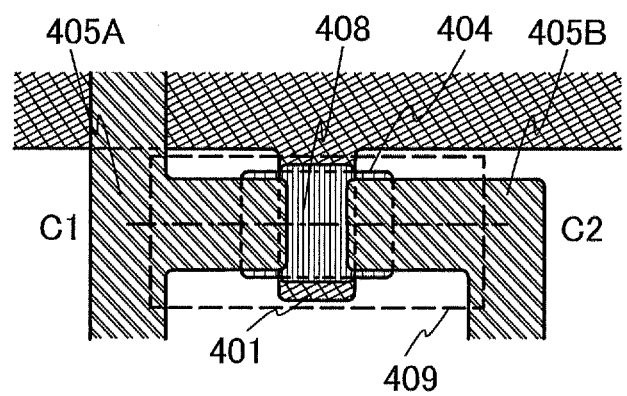
FIGS. 14A and 14B are a top view and a cross-sectional view of a transistor according to an embodiment of the present invention.
Figure 14B:
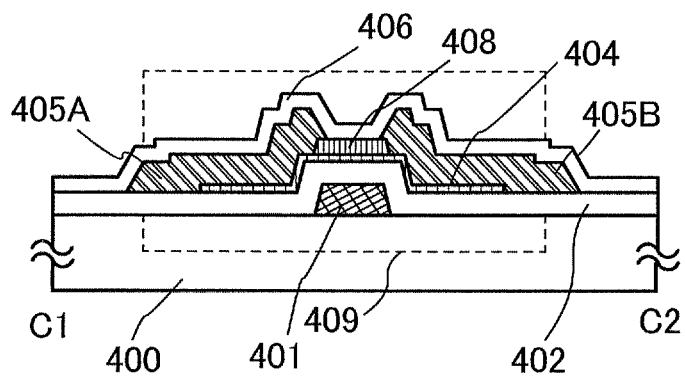

FIG. 14A is a top view of the case where a channel-stop bottom gate transistor is applied to a sampling transistor of a pixel. FIG. 14B is a cross-sectional view taken along chain line C1-C2 in the top view of FIG. 14A.

The cross-sectional view of FIG. 14B is described as in the case of the channel-stop bottom gate transistor illustrated in FIGS. 12A to 12D. The top view of the sampling transistor of the pixel illustrated in FIG. 14A can also be similarly described. For example, in a pixel portion, a signal line corresponds to the source electrode 405A and a scan line corresponds to the gate electrode layer 401, and a channel formation region corresponds to the oxide semiconductor film 404. An electrode extending from the sampling transistor to the driving transistor corresponds to the drain electrode 405B, and a channel-stop film corresponds to the insulating film 408.

As described above, the channel-stop bottom gate transistor 409 can be applied to the sampling transistor of the pixel.

According to this embodiment, it is possible to provide a highly reliable transistor having high field-effect mobility and extremely small off-state current which includes an oxide semiconductor and in which variation in threshold voltage is small.

Embodiment 3

In this embodiment, a c-axis aligned crystalline oxide semiconductor (CAAC-OS) film will be described in detail.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

With the use of the CAAC-OS film in a transistor, change in electric characteristics of the transistor due to irradiation with visible light or ultraviolet light can be reduced. Thus, the transistor has high reliability.

CAAC-OS will be described in detail with reference to FIGS. 15A to 15E, FIGS. 16A to 16C, and FIGS. 17A to 17C. In FIGS. 15A to 15E, FIGS. 16A to 16C, and FIGS. 17A to 17C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 15A to 15E, O surrounded by a circle represents tetracoordinate O and O surrounded by a double circle represents tricoordinate O.

Figure 15A:
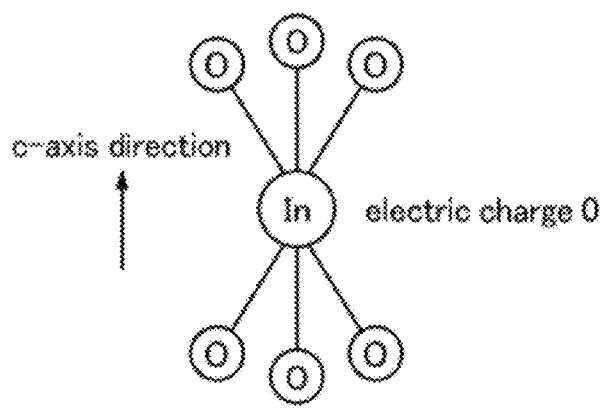
FIG. 15A to 15E are diagrams each illustrating a crystal structure of an oxide material.

FIG. 15A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 15A is actually an octahedral structure, but is illustrated as a planar structure for simplicity. Note that three tetracoordinate O atoms exist in each of an upper half and a lower half in FIG. 15A. In the small group illustrated in FIG. 15A, electric charge is 0.

Figure 15D:
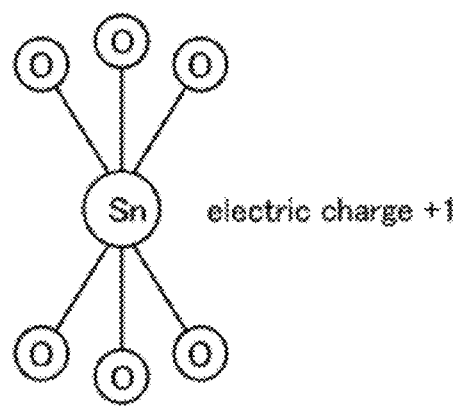
Figure 15B:
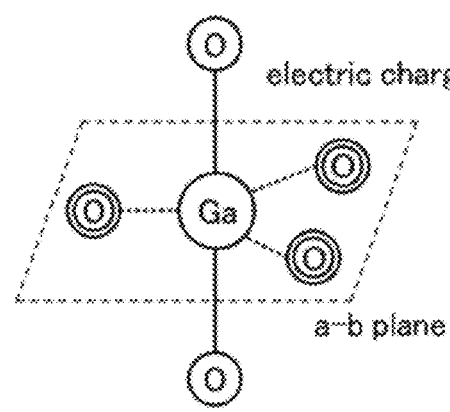

FIG. 15B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 15B. An In atom can also have the structure illustrated in FIG. 15B because an In atom can have five ligands. In the small group illustrated in FIG. 15B, electric charge is 0.

Figure 15E:
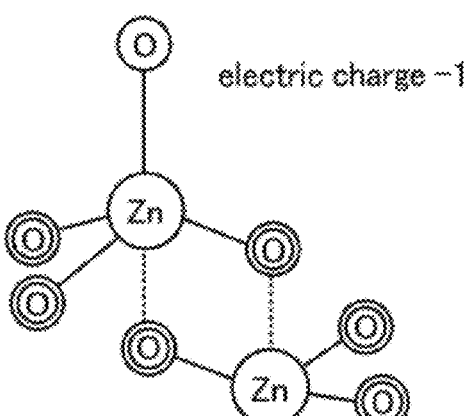
Figure 15C:
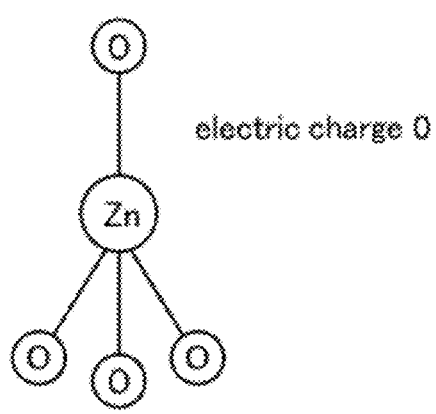

FIG. 15C illustrates a structure including one tetracoordinate Zn atom and four tetracoordinate O atoms proximate to the Zn atom. In FIG. 15C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 15C. In the small group illustrated in FIG. 15C, electric charge is 0.

FIG. 15D illustrates a structure including one hexacoordinate Sn atom and six tetracoordinate O atoms proximate to the Sn atom. In FIG. 15D, three tetracoordinate O atoms exist in each of an upper half and a lower half In the small group illustrated in FIG. 15D, electric charge is +1.

FIG. 15E illustrates a small group including two Zn atoms. In FIG. 15E, one tetracoordinate O atom exists in each of an upper half and a lower half In the small group illustrated in FIG. 15E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 15A each have three proximate In atoms in the downward direction, and the three O atoms in the lower half each have three proximate In atoms in the upward direction. The one O atom in the upper half with respect to the pentacoordinate Ga atom in FIG. 15B has one proximate Ga atom in the downward direction, and the one O atom in the lower half has one proximate Ga atom in the upward direction. The one O atom in the upper half with respect to the tetracoordinate Zn atom in FIG. 15C has one proximate Zn atom in the downward direction, and the three O atoms in the lower half each have three proximate Zn atoms in the upward direction. In this manner, the number of tetracoordinate O atoms above a metal atom is equal to the number of metal atoms proximate to and below the tetracoordinate O atoms; similarly, the number of tetracoordinate O atoms below a metal atom is equal to the number of metal atoms proximate to and above the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason will be described hereinafter. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 16A:
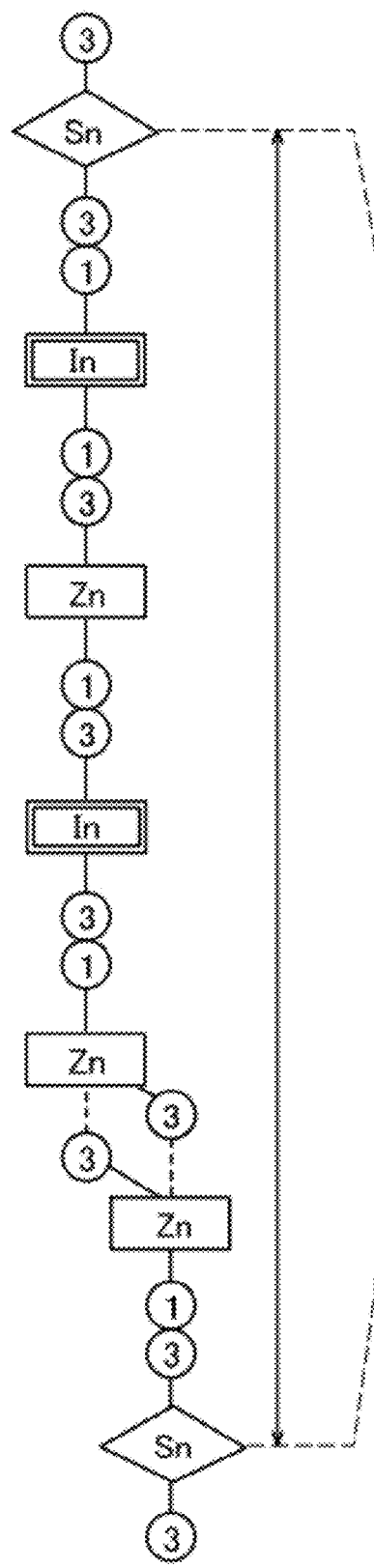
FIG. 16A to 16C are diagrams illustrating a crystal structure of an oxide material.
Figure 16B:
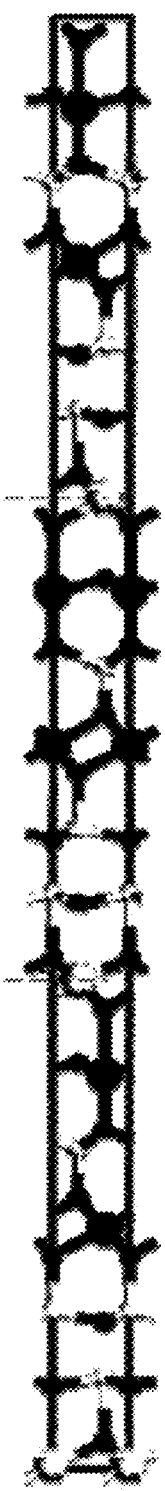
Figure 16C:

FIG. 16A illustrates a model of a medium group included in a layered structure of an In—Sn—Zn-based oxide material. FIG. 16B illustrates a large group including three medium groups. Note that FIG. 16C illustrates an atomic arrangement in the case where the layered structure in FIG. 16B is observed from the c-axis direction.

In FIG. 16A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 16A, one tetracoordinate O atom existing in each of an upper half and a lower half with respect to an In atom is denoted by circled 1. FIG. 16A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide material in FIG. 16A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge of a small group including a Sn atom is +1. Therefore, electric charge of −1, which cancels +1, is needed to form a layered structure including a Sn atom. As a structure having electric charge of −1, the small group including two Zn atoms as illustrated in FIG. 15E can be given. For example, with one small group including two Zn atoms, electric charge of one small group including a Sn atom can be cancelled, so that the total electric charge of the layered structure can be 0.

When the large group illustrated in FIG. 16B is repeated, crystal of an In—Sn—Zn-based oxide material ($In_2SnZn_3O_8$) can be obtained. Note that a layered structure of the obtained crystal of an In—Sn—Zn-based oxide material can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Pm—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a one-component metal oxide such as an In-based oxide, a Sn-based oxide, or a Zn-based oxide; and the like.

Figure 17A:
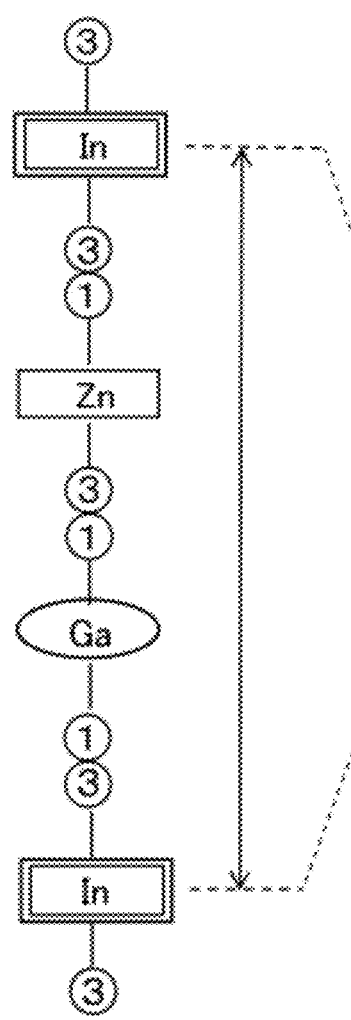
FIG. 17A to 17C are diagrams illustrating a crystal structure of an oxide material.

For example, FIG. 17A illustrates a model of a medium group included in a layered structure of an In—Ga—Zn-based oxide material.

In the medium group included in the layered structure of the In—Ga—Zn-based oxide material in FIG. 17A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 17B:
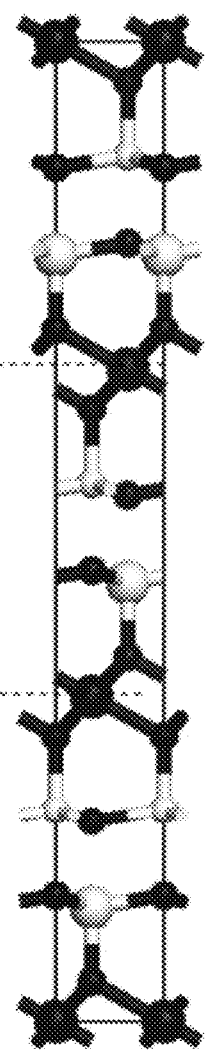
Figure 17C:
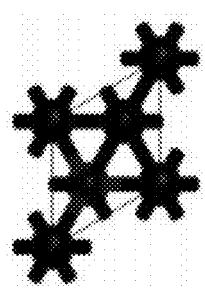

FIG. 17B illustrates a large group including three medium groups. Note that FIG. 17C illustrates an atomic arrangement in the case where the layered structure in FIG. 17B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide material, a large group can be formed using not only the medium group illustrated in FIG. 17A but also a medium group in which the arrangement of the In atom, the Ga atom, and the Zn atom is different from that in FIG. 17A.

This embodiment can be implemented in appropriate combination with the structures described in the other embodiments.

Embodiment 4

In this embodiment, appearance and a cross section of an EL display device having a display function and using transistors including oxide materials in a pixel portion and a driver circuit will be described with reference to FIGS. 18A and 18B. FIG. 18A is a plan view of a panel in which a transistor which includes a stacked oxide material including a c-axis-aligned crystal layer and an EL element formed over a first substrate are sealed between the first substrate and a second substrate with a sealant. FIG. 18B is a cross-sectional view taken along line H-I of FIG. 18A.

A sealant 4505 is provided to surround a pixel portion 4502, a signal line driver circuit 4503, a scan line driver circuit 4504, and a power supply line driver circuit 4500, which are provided over a first substrate 4501. Further, a second substrate 4506 is provided over the pixel portion 4502, the signal line driver circuit 4503, the scan line driver circuit 4504, and the power supply line driver circuit 4500. Accordingly, the pixel portion 4502, the signal line driver circuit 4503, the scan line driver circuit 4504, and the power supply line driver circuit 4500 are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuit 4503, the scan line driver circuit 4504, and the power supply line driver circuit 4500 formed over the first substrate 4501 each include a plurality of transistors, and a transistor 4510 included in the pixel portion 4502 and a transistor 4509 included in the signal line driver circuit 4503 are illustrated as an example in FIG. 18B.

For the transistors 4509 and 4510, the transistor described in Embodiment 2 can be employed. In this embodiment, the transistors 4509 and 4510 are n-channel transistors.

Over an insulating layer 4544, a conductive layer 4540 is provided in a position overlapping with a channel formation region of an oxide semiconductor layer of the transistor 4509 used for the driver circuit. By providing the conductive layer 4540 so as to overlap with the channel formation region of the oxide semiconductor layer, the amount of change in the threshold voltage of the transistor 4509 before and after the BT test can be reduced. Further, potential of the conductive layer 4540 may be the same as or different from that of a gate electrode layer of the transistor 4509. The conductive layer 4540 can function also as a second gate electrode layer. Alternatively, the potential of the conductive layer 4540 may be GND or 0 V, or the conductive layer 4540 may be in a floating state.

In the transistor 4509, an insulating layer 4541 is formed in contact with the semiconductor layer including the channel formation region, as a protective insulating layer. Moreover, the insulating layer 4544 functioning as a planarization insulating layer covers the transistors in order to reduce surface unevenness due to the transistors. Here, a silicon oxide layer is formed as the insulating layer 4541 by a sputtering method.

The insulating layer 4544 is formed as the planarization insulating layer over the insulating layer 4541. As the insulating layer 4544, an organic material having heat resistance such as polyimide, acrylic, a benzocyclobutene-based resin, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4544 may be formed by stacking a plurality of insulating layers formed using any of these materials. Here, acrylic is used for the insulating layer 4544.

Note that reference numeral 4511 denotes an EL element. A first electrode layer 4517 which is a pixel electrode included in the EL element 4511 is electrically connected to a source electrode layer or a drain electrode layer of the transistor 4510. Note that the structure of the EL element 4511 is not limited to a stacked-layer structure of the first electrode layer 4517, an electroluminescent layer 4512, and a second electrode layer 4513. The structure of the EL element 4511 can be changed as appropriate depending on the direction in which light is extracted from the EL element 4511, or the like.

A partition 4520 is made of an organic resin layer, an inorganic insulating layer, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective layer may be formed over the second electrode layer 4513 and the partition 4520 in order to prevent oxygen, hydrogen, moisture, carbon dioxide, or the like from entering the EL element 4511. As the protective layer, a silicon nitride layer, a silicon nitride oxide layer, a DLC layer, or the like can be formed.

In addition, a variety of signals and potentials are supplied from an FPC 4518 to the signal line driver circuit 4503, the scan line driver circuit 4504, the power supply line driver circuit 4500, and the pixel portion 4502.

A connection terminal electrode 4515 is formed using the same conductive layer as the first electrode layer 4517 included in the EL element 4511, and a terminal electrode 4516 is formed using the same conductive layer as the source and drain electrode layers included in the transistors 4509 and 4510.

The connection terminal electrode 4515 is electrically connected to a terminal of the FPC 4518 through an anisotropic conductive layer 4519.

The second substrate positioned in the direction in which light is extracted from the EL element 4511 needs to have light-transmitting properties. In that case, a light-transmitting material such as a glass plate, a plastic plate, a polyester film, or an acrylic film is used for the second substrate.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used for the filler.

As needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the EL element. Further, the polarizing plate or the circularly polarizing plate may be provided with an anti-reflection film. For example, anti-glare treatment by which reflected light can be diffused by projections and depressions on the surface so as to reduce the glare can be performed.

Through the above process, the EL display device with a narrow frame can be manufactured.

This embodiment can be implemented in appropriate combination with the structures described in the other embodiments.

Embodiment 5

An EL display device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 19:
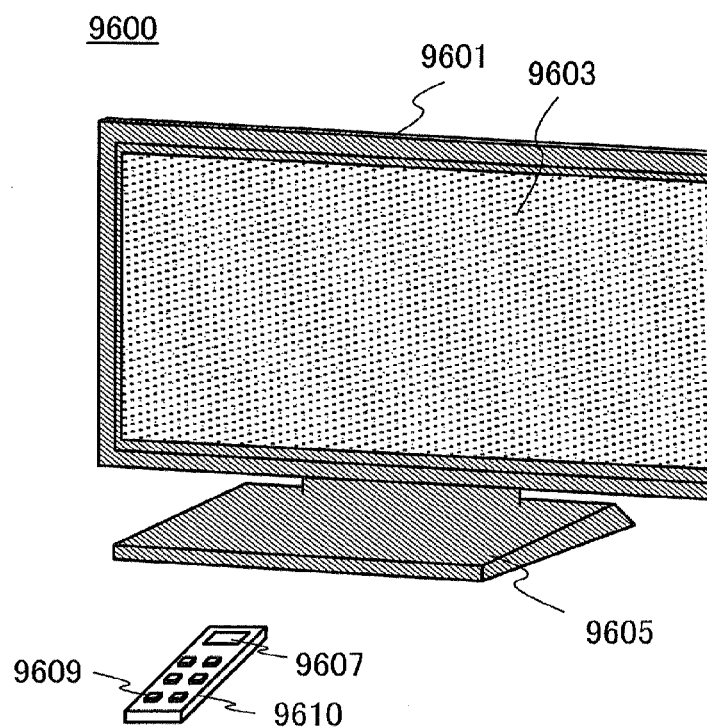
FIG. 19 illustrates an example of an electronic device.

FIG. 19 illustrates a television set 9600 as one example of such electronic devices. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

In the display portion 9603, a plurality of transistors described in Embodiment 2 are provided as switching elements of pixels, and a transistor described in Embodiment 2 is provided in a driver circuit such as a power supply line driver circuit formed over the same insulating substrate as the display portion 9603. Accordingly, the television set with a narrow frame can be manufactured.

This embodiment can be implemented in appropriate combination with the structures described in the other embodiments.

Example 1

In this example, a crystal state of an In—Sn—Zn-based oxide film is described.

First, X-ray diffraction (XRD) analysis of an In—Sn—Zn-based oxide film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

First, a quartz substrate which had been subjected to dehydrogenation treatment was prepared.

Next, an In—Sn—Zn-based oxide film with a thickness of 100 nm was formed over the quartz substrate.

The In—Sn—Zn-based oxide film was formed with a sputtering apparatus with a power of 100 W (DC) in an oxygen atmosphere. An In—Sn—Zn—O target of In:Sn:Zn=1:1:1 [atomic ratio] was used as a target. Note that the substrate heating temperature in film formation was set at room temperature or 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 20:
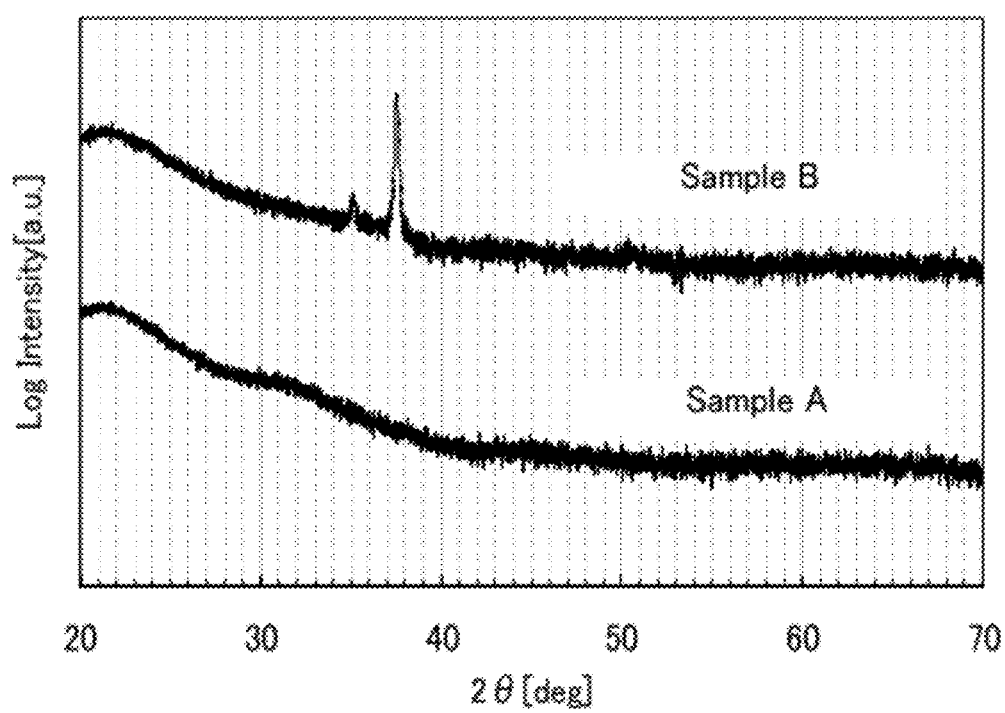
FIG. 20 shows XRD spectra of In—Sn—Zn-based oxide films.

FIG. 20 shows XRD spectra of Sample A and Sample B. No peak derived from crystal was observed in Sample A, whereas peaks derived from crystal were observed when 2η was around 35 deg. and at 37 deg. to 38 deg. in Sample B.

Figure 21:
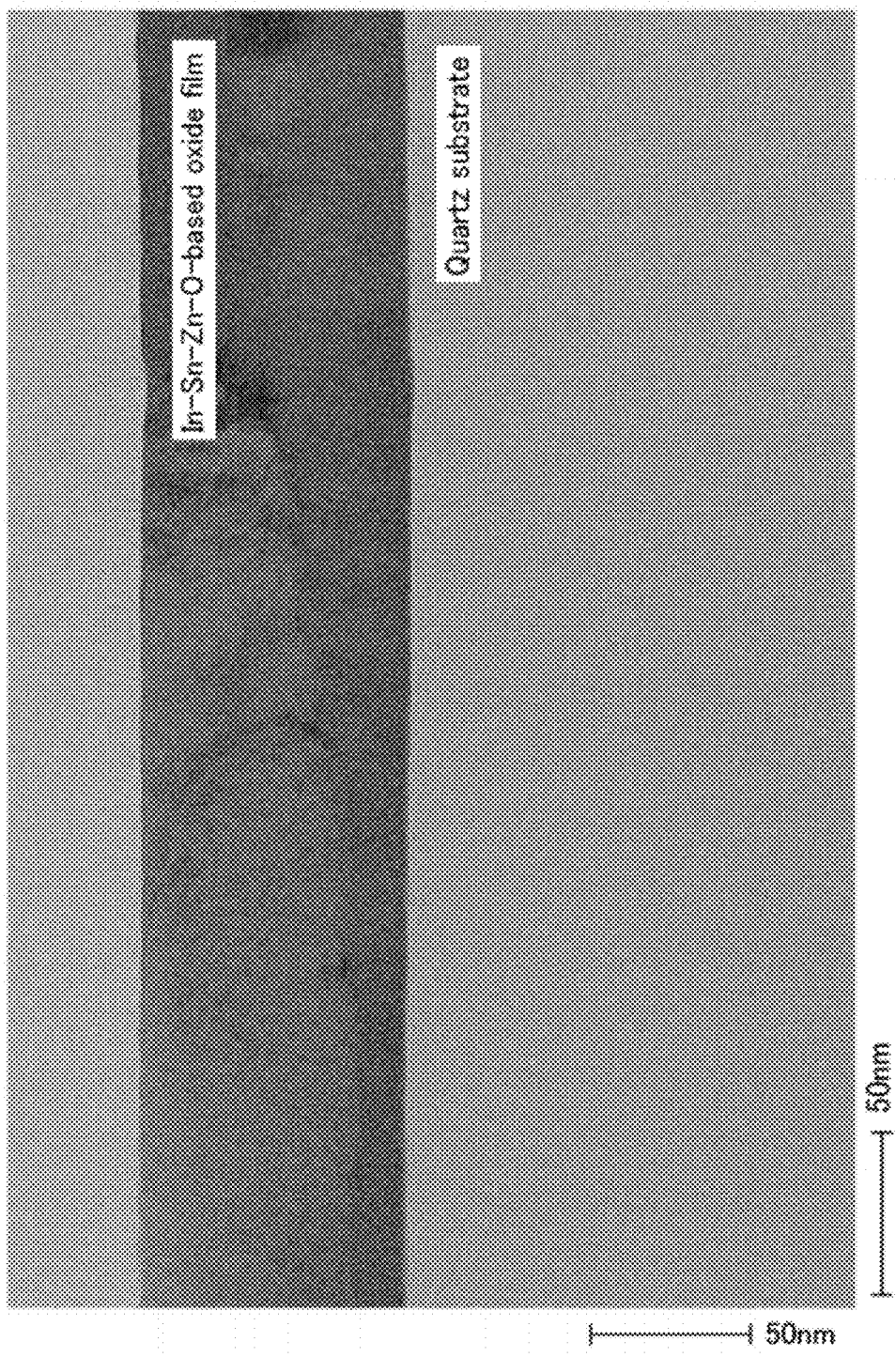
FIG. 21 is a cross-sectional TEM image of an In—Sn—Zn-based oxide film.
Figure 22:
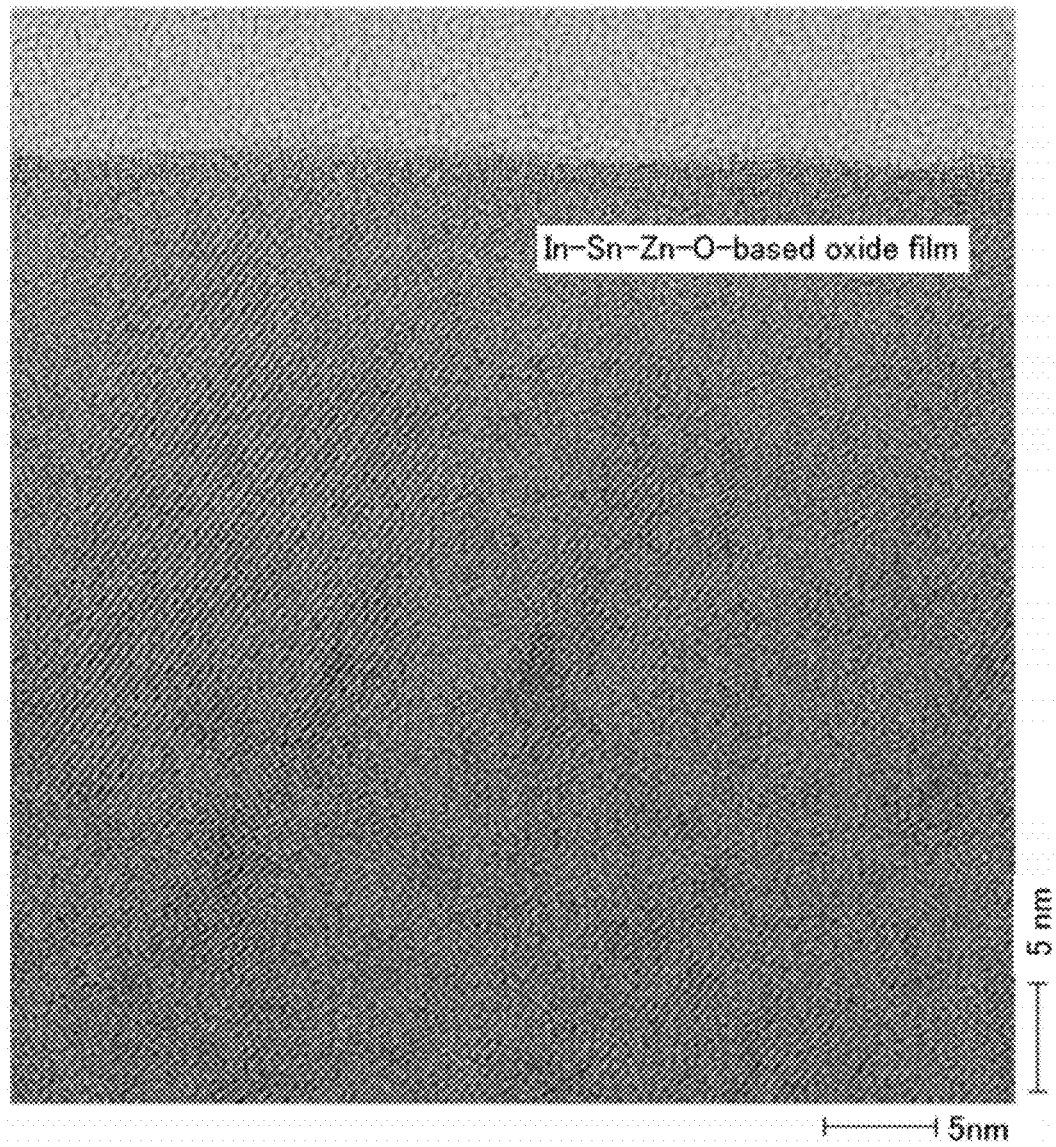
FIG. 22 is a cross-sectional TEM image of an In—Sn—Zn-based oxide film.
Figure 23:
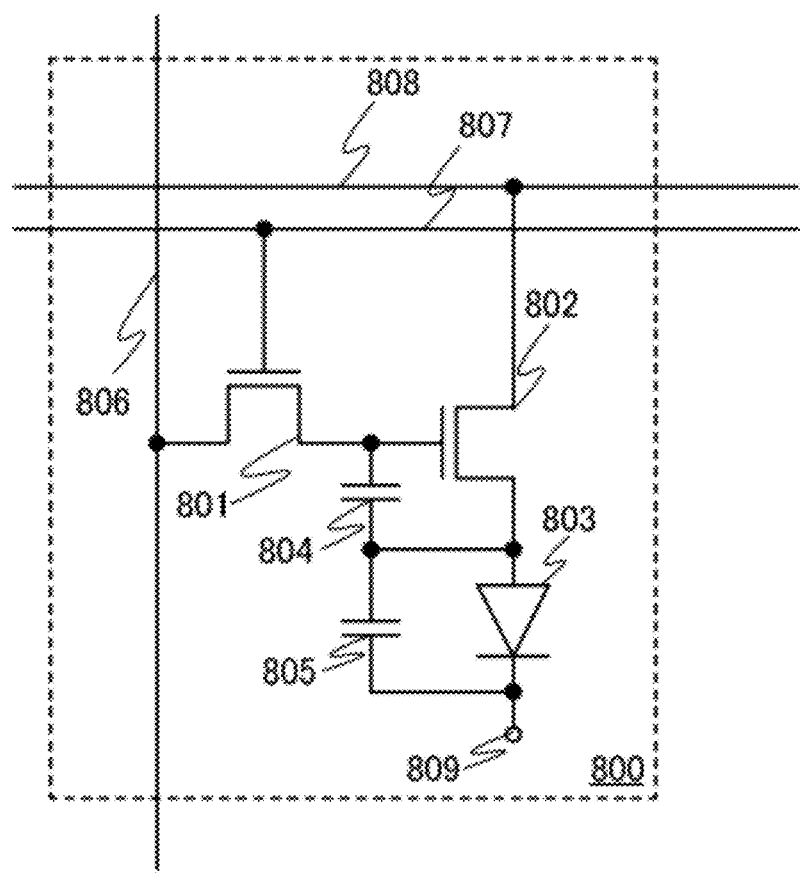
FIG. 23 shows a pixel of an EL display device.
Figure 24:
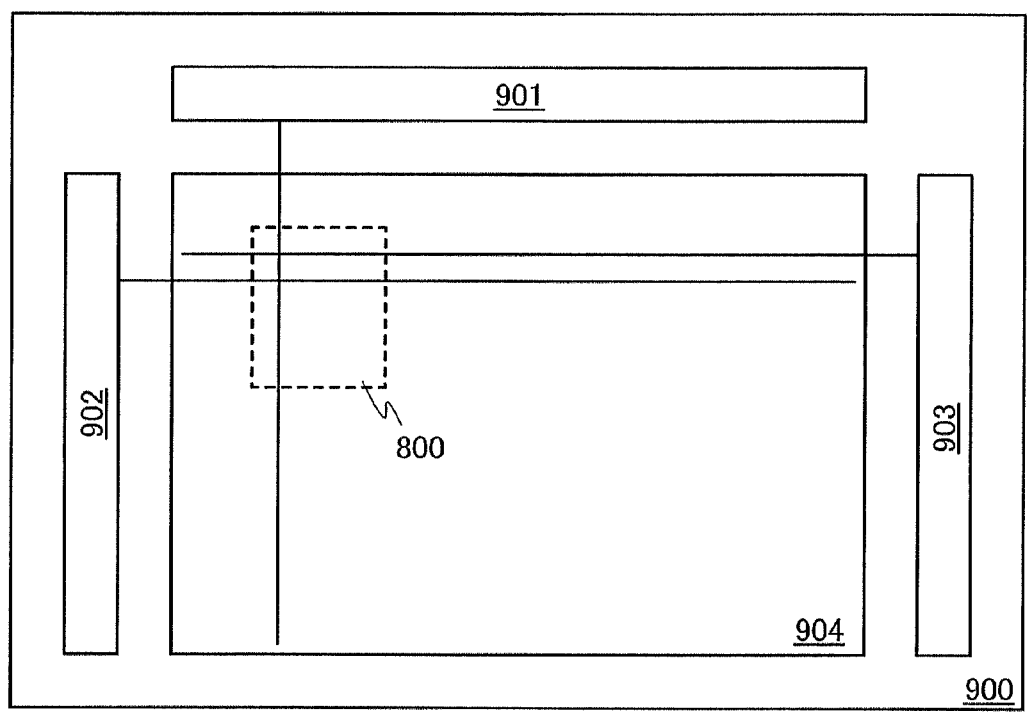
FIG. 24 is a block diagram of an EL display device.

FIG. 21 and FIG. 22 are cross-sectional images of Sample B which were obtained with a transmission electron microscope (TEM).

FIG. 21 is a cross-sectional TEM image at a magnification of 0.5 million times, and FIG. 22 is a cross-sectional TEM image at a magnification of 4 million times. Note that H-9000NAR manufactured by Hitachi, Ltd was used as the TEM, and the acceleration voltage was 300 kV.

As can be seen in FIG. 21 and FIG. 22, the In—Sn—Zn-based oxide film of Sample B is polycrystalline, where crystals are oriented in various directions.

This application is based on Japanese Patent Application serial no. 2011-107763 filed with Japan Patent Office on May 13, 2011, the entire contents of which are hereby incorporated by reference.

What is claimed is:

1. A display device comprising:
a pixel portion comprising a plurality of pixels over a first substrate;
a plurality of signal lines over the first substrate;
a plurality of scan lines over the first substrate;
a plurality of power supply lines over the first substrate; and
a power supply line driver circuit comprising an inverter comprising a transistor, the power supply line driver circuit being provided over the first substrate,
wherein the inverter and the pixel portion are formed over the first substrate,
wherein the transistor has a field-effect mobility of higher than or equal to 80 cm$^2$/Vs,
wherein the power supply line driver circuit is configured to drive the plurality of power supply lines,
wherein the transistor comprises an oxide semiconductor layer,
wherein the oxide semiconductor layer comprises a channel formation region, and
wherein each of the plurality of pixels comprises an EL element.

2. The display device according to claim 1, wherein the transistor has a field-effect mobility of higher than or equal to 120 cm$^2$/Vs.

3. The display device according to claim 1,
wherein each of the plurality of pixels comprises a sampling transistor and a driving transistor, and
wherein each of the sampling transistor and the driving transistor comprises an oxide semiconductor layer.

4. The display device according to claim 1, wherein the channel formation region overlaps with a gate electrode layer with a gate insulating layer interposed therebetween.

5. The display device according to claim 4, wherein the oxide semiconductor layer is a highly purified oxide semiconductor layer.

6. The display device according to claim 5, wherein the highly purified oxide semiconductor layer is a semiconductor which contains at least one kind of element selected from the group consisting of In, Sn, and Zn.

7. The display device according to claim 1, wherein the power supply line driver circuit includes a shift register.

8. The display device according to claim 1, further comprising:
a second substrate opposed to the first substrate,
wherein each of the plurality of signal lines is provided to a corresponding one of the plurality of pixels,
wherein each of the plurality of scan lines is provided to a corresponding one of the plurality of pixels,
wherein each of the plurality of power supply lines is provided to a corresponding one of the plurality of pixels,
wherein the power supply line driver circuit is provided in an outer region of the pixel portion, and is provided between the pixel portion and a termination of the first substrate,
wherein the pixel portion is surrounded by a sealant,
wherein a whole part of the power supply line driver circuit is provided inside the sealant, and
wherein the power supply line driver circuit is overlapped with the second substrate.

9. A display device comprising:
a plurality of pixels over a first substrate;
a plurality of signal lines over the first substrate;
a plurality of scan lines over the first substrate;
a plurality of power supply lines over the first substrate;
a power supply line driver circuit comprising the plurality of power supply lines and a first transistor, the power supply line driver circuit being provided over the first substrate; and
a scan line driver circuit comprising the plurality of scan lines and a second transistor, the scan line driver circuit being provided over the first substrate in an outer region and at the periphery of the pixel portion,
wherein each of the first transistor and the second transistor comprises an oxide semiconductor layer,
wherein the oxide semiconductor layer comprises a channel formation region,
wherein each of the first transistor and the second transistor has a field-effect mobility of higher than or equal to 80 cm$^2$/Vs, and
wherein the display device is an active matrix EL display device.

10. The display device according to claim 9, wherein each of the first transistor and the second transistor has a field-effect mobility of higher than or equal to 120 cm$^2$/Vs.

11. The display device according to claim 9,
wherein each of the plurality of pixels comprises a sampling transistor and a driving transistor, and
wherein each of the sampling transistor and the driving transistor comprises an oxide semiconductor layer.

12. The display device according to claim 9, wherein the channel formation region overlaps with a gate electrode layer with a gate insulating layer interposed therebetween.

13. The display device according to claim 12, wherein the oxide semiconductor layer is a highly purified oxide semiconductor layer.

14. The display device according to claim 13, wherein the highly purified oxide semiconductor layer is a semiconductor which contains at least one kind of element selected from the group consisting of In, Sn, and Zn.

15. The display device according to claim 9, further comprising:
a second substrate opposed to the first substrate; and
a pixel portion comprising the plurality of pixels,
wherein each of the plurality of signal lines is provided to a corresponding one of the plurality of pixels,
wherein each of the plurality of scan lines is provided to a corresponding one of the plurality of pixels,
wherein each of the plurality of power supply lines is provided to a corresponding one of the plurality of pixels,
wherein the power supply line driver circuit is configured to drive the plurality of power supply lines,
wherein the scan line driver circuit is configured to drive the plurality of scan lines, wherein the power supply line driver circuit is provided in an outer region of the pixel portion, and is provided between the pixel portion and a termination of the first substrate, wherein the pixel portion is surrounded by a sealant, wherein a whole part of the power supply line driver circuit is provided inside the sealant, and wherein the power supply line driver circuit is overlapped with the second substrate.

16. A display device comprising:

a plurality of pixels over a first substrate;

a plurality of signal lines over the first substrate;

a plurality of scan lines over the first substrate;

a plurality of power supply lines over the first substrate;

a power supply line driver circuit comprising the plurality of power supply lines and a first transistor, the power supply line driver circuit being provided over the first substrate;

a scan line driver circuit comprising the plurality of scan lines and a second transistor, the scan line driver circuit being provided over the first substrate in an outer region and at the periphery of the pixel portion; and a signal line driver circuit comprising the plurality of signal lines and a third transistor, the signal line driver circuit being provided over the first substrate in an outer region and at the periphery of the pixel portion, wherein each of the first transistor, the second transistor and the third transistor comprises an oxide semiconductor layer, wherein the oxide semiconductor layer comprises a channel formation region, wherein each of the first transistor, the second transistor and the third transistor has a field-effect mobility of higher than or equal to 80 cm$^2$/Vs, and wherein the display device is an active matrix EL display device.

17. The display device according to claim 16, wherein each of the first transistor, the second transistor and the third transistor has a field-effect mobility of higher than or equal to 120 cm$^2$/Vs.

18. The display device according to claim 16, wherein each of the plurality of pixels comprises a sampling transistor and a driving transistor, and wherein each of the sampling transistor and the driving transistor comprises an oxide semiconductor layer.

19. The display device according to claim 16, wherein the channel formation region overlaps with a gate electrode layer with a gate insulating layer interposed therebetween.

20. The display device according to claim 19, wherein the oxide semiconductor layer is a highly purified oxide semiconductor layer.

21. The display device according to claim 20, wherein the highly purified oxide semiconductor layer is a semiconductor which contains at least one kind of element selected from the group consisting of In, Sn, and Zn.

22. The display device according to claim 16, further comprising:

a second substrate opposed to the first substrate; and a pixel portion comprising the plurality of pixels, wherein each of the plurality of signal lines is provided to a corresponding one of the plurality of pixels, wherein each of the plurality of scan lines is provided to a corresponding one of the plurality of pixels, wherein each of the plurality of power supply lines is provided to a corresponding one of the plurality of pixels, wherein the power supply line driver circuit is configured to drive the plurality of power supply lines, wherein the power supply line driver circuit is provided in an outer region of the pixel portion, and is provided between the pixel portion and a termination of the first substrate, wherein the pixel portion is surrounded by a sealant, wherein a whole part of the power supply line driver circuit is provided inside the sealant, wherein the scan line driver circuit is configured to drive the plurality of scan lines, wherein the signal line driver circuit is configured to drive the plurality of signal lines, and wherein the power supply line driver circuit is overlapped with the second substrate.

23. A display device comprising:

a pixel comprising a first transistor and an EL element;

a power supply line; and a power supply line driver circuit comprising an inverter, wherein one of a source and a drain of the first transistor is electrically connected to the EL element, wherein the other of the source and the drain of the first transistor is electrically connected to the power supply line, wherein an output terminal of the inverter is electrically connected to the power supply line, wherein the pixel and the inverter are formed over a same substrate, wherein the inverter comprises a second transistor, and wherein the second transistor comprises an oxide semiconductor layer comprising a channel formation region.

* * * * *